(12) United States Patent
Kocis et al.

(10) Patent No.: US 8,788,068 B2
(45) Date of Patent: Jul. 22, 2014

(54) MODELING TOOL FOR PLANNING THE OPERATION OF REFINERIES

(75) Inventors: Gary R. Kocis, Vienna, VA (US); Philip H. Warrick, Oakton, VA (US); Victor P. DePaola, Vienna, VA (US)

(73) Assignee: ExxonMobil Research and Engineering Company, Annandale, NJ (US)

( * ) Notice: Subject to any disclaimer, the term of this patent is extended or adjusted under 35 U.S.C. 154(b) by 357 days.

(21) Appl. No.: 13/007,877

(22) Filed: Jan. 17, 2011

(65) Prior Publication Data

US 2012/0083914 A1 Apr. 5, 2012

Related U.S. Application Data

(60) Provisional application No. 61/389,965, filed on Oct. 5, 2010.

(51) Int. Cl.
*G05B 13/02* (2006.01)
*G06F 19/00* (2011.01)

(52) U.S. Cl.
USPC ............................ 700/29; 700/28; 700/100

(58) Field of Classification Search
USPC .......................................... 700/29, 100, 28
See application file for complete search history.

(56) References Cited

U.S. PATENT DOCUMENTS

| | | | | |
|---|---|---|---|---|
| 7,627,461 | B2 * | 12/2009 | Guyaguler et al. | 703/10 |
| 2005/0171746 | A1 * | 8/2005 | Thalhammer-Reyero | 703/2 |
| 2005/0188841 | A1 * | 9/2005 | Khan | 95/8 |
| 2007/0020173 | A1 * | 1/2007 | Repasky et al. | 423/650 |

FOREIGN PATENT DOCUMENTS

WO 2010042223 A1 4/2010

OTHER PUBLICATIONS

Josef Kallrath, Solving planning and design problems in the process industry using mixed integer and global optimization, Nov. 2005, Annals of operation research, vol. 140, issue 1 p. 339-373.*
Karuppiah et al., "Global Optimization for Scheduling Refinery Crude Oil Operations", Computers & Chemical Engineering, vol. 32, pp. 2745-2766 (2008).
Mouret et al., "A Novel Priority-Slot Based Continuous-Time Formulation for Crude-Oil Scheduling Problems", Industrial Engineering & Chemical Research, vol. 48, pp. 8515-8528 (2009).
PCT/US2011/054548, PCT International Search Report, Form PCT/ISA/210, dated Dec. 6, 2011, 3 pgs.
PCT/US2011/054548, PCT Written Opinion of the International Searching Authority, Form PCT/ISA/237, dated Dec. 6, 2011, 5 pgs.

* cited by examiner

*Primary Examiner* — Mohammad Ali
*Assistant Examiner* — Ziaul Karim
(74) *Attorney, Agent, or Firm* — Glenn T. Barrett

(57) ABSTRACT

A modeling tool for determining the operation of a production facility. A variety of different activities can be modeled, including (a) feed material selection, including quantity and timing, (b) product sales, including quantity and timing, (c) process operations, including process conditions and timing, (d) blending operations, including process conditions and timing, and/or (e) inventory management. The modeling tool may represent time using continuous-time, discrete-time, asynchronous time periods, synchronous time periods, and combinations of these various approaches.

14 Claims, 13 Drawing Sheets

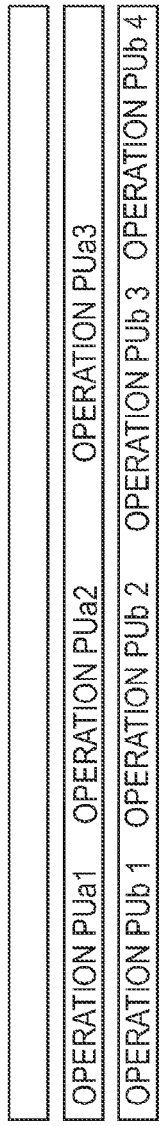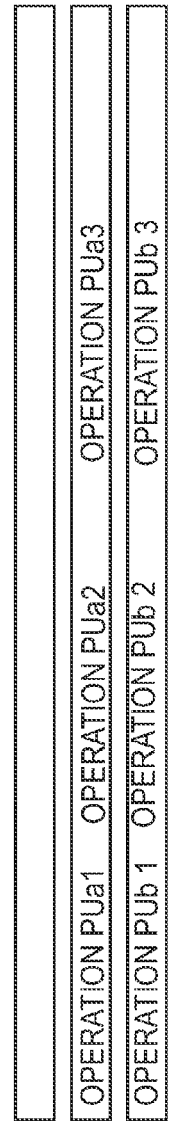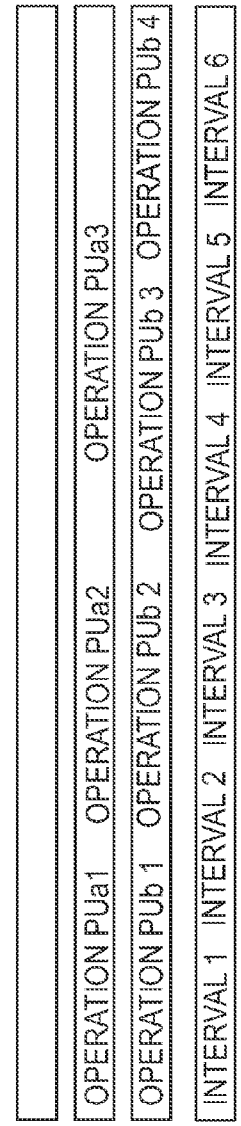

TIME HORIZON:

PUa

PUb

TIME INTERVALS FOR TNK1

FIG. 17

| SHIP | SHIP - SOURCE | TIME INTERVALS | SHIP #1 | | | | SHIP #2 | | TIME AFTER LAST SHIP |
|---|---|---|---|---|---|---|---|---|---|
| PROCESS UNIT | CDU - DISPOSITION | 3 | | | | | ASPHALT? | RESID? | RESID? |
| | | 6 | | | | | | | |
| TANK | CRUDE2 | 8 | SHIP/O | NO/A | SHIP/O | SHIP/O | NO/R | SHIP/O | NO/R |
| AFTER CONSOLIDATION TANK: | CRUDE2 | 6 | | | SHIP/O | | NO/R | | NO/R |

FIG. 18

ASYNCHRONOUS DISCRETE TIME

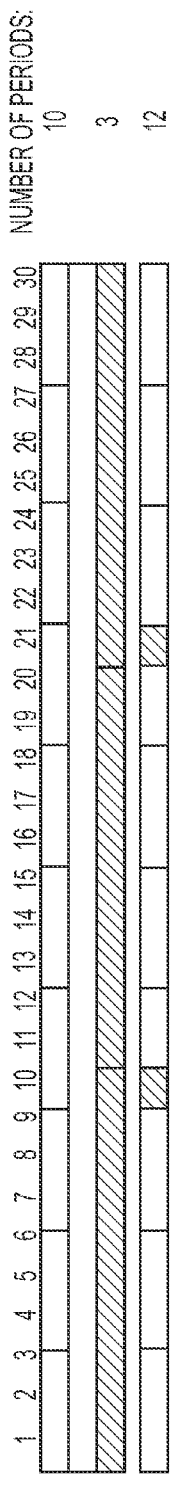

| GIVEN PERIOD LENGTH | NUMBER OF PERIODS |
|---|---|
| 3 CDU | 10 |
| 10 CCU | 3 |
| VGO TANK | 12 |

FIG. 19

SYNCHRONOUS DISCRETE TIME

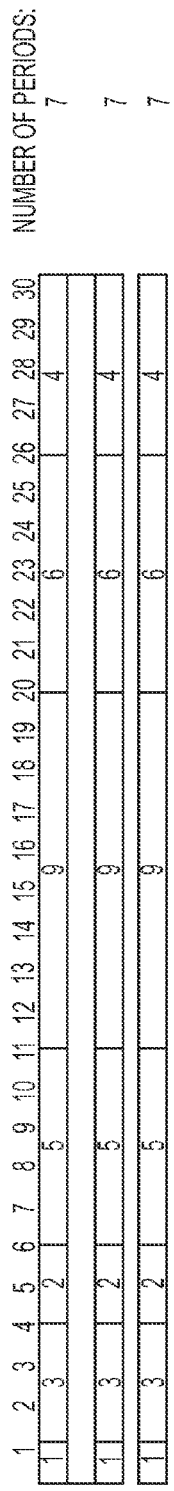

| GIVEN PERIOD LENGTH | NUMBER OF PERIODS |
|---|---|
| 7 CDU | 7 |
| 7 CCU | 7 |
| VGO TANK | 7 |

__US 8,788,068 B2__

MODELING TOOL FOR PLANNING THE OPERATION OF REFINERIES

CROSS-REFERENCES TO RELATED APPLICATIONS

This application claims the benefit of U.S. Provisional Application No. 61/389,965 (filed on 5 Oct. 2010), which is incorporated by reference herein.

TECHNICAL FIELD

The present invention relates to methods for optimizing the operation of refineries and the related supply chains.

BACKGROUND

Planning tools are widely used in the petrochemical industry to assist in the planning of activities in a refinery. Among the planning tools widely used in the petrochemical industry are PIMS by AspenTech, RPMS by Honeywell, and GRT-MPS by Haverly Systems. The models used in these tools are typically composed of:
- raw material (e.g. crude oil) supply data, including quantities and prices,
- raw material characterization data,
- product (e.g. gasoline, diesel) demand data, including quantities and prices,
- process models which represent the production facilities,
- product blending models which represent the blending facilities and specifications, and
- other constraints.

These planning tools can be used as decision support aids for raw material purchases, refinery operations, product sales, or other planning decisions. Traditionally, raw material purchase and product sales decisions are made on the basis of a planning optimization model that represents the time horizon as one period with average conditions being assumed throughout each period (i.e. period-average models). The task of developing the raw material delivery schedule and the production schedule are predominantly separate activities which are finalized after the period average plan for raw material purchases and production has been developed. Given these purchases and sales decisions, more detailed production planning and/or production scheduling are performed as subsequent steps. Ideally, a feasible production schedule would be developed that is consistent and equivalent to the planning model result. In practice, however, the process operation is not uniform over the time horizon and a planning model which assumes this to be true often leads to a planning result which cannot be converted into an equivalent schedule.

A simulation model may be used to support the development of a production schedule. The production schedule may include changes in various process operations which are scheduled to start and end at certain times during the time horizon. Raw material deliveries and product shipments are to be scheduled such that these are consistent and feasible with the production schedule. Often, transportation costs are significant and the minimization of transportation costs is important. Inventory dynamics within each period are not considered in the production planning activity since the plan is performed with a period average view of the production. However, inventory and the fluctuation of material inventory levels within each period can be important in the production schedule. Typically, the production scheduling activity seeks to find a feasible schedule which matches the production plan, where feasibility includes keeping inventory levels within the allowed range (minimum and maximum levels) at all times during the time horizon. An additional objective is to minimize the inventory holding costs (i.e. minimize capital costs).

Scheduling tools may be used to obtain a feasible schedule for raw material delivery, production, and product shipments. Examples of such production scheduling tools are ORION by AspenTech, Production Scheduler by Honeywell, H/SCHED by Haverly Systems, and SIMTO by M3 Technology. It is desirable for the planning models and the scheduling models to be consistent. Even so, there is no guarantee that the production plan can be converted into an equivalent production schedule. One weakness of this approach is that production planning and production scheduling are performed as two separate sequential steps. The optimization model used for raw material valuation and selection decisions does not reflect scheduling considerations. This can limit the quality of the solution obtained from this optimization model. When the scheduling considerations have a significant impact on the purchase and sales decisions, the absence of these factors in the optimization model can lead to a non-optimal overall solution. Thus, it is desirable to optimize a combination of several or all of these activities as one unified activity.

Notable publications on the topic of developing models for scheduling problems include the following: (1) R. Karuppiah, K. C. Furman, and I. E. Grossmann, "Global Optimization for Scheduling Refinery Crude Oil Operations," *Computers & Chemical Engineering* 32, 2745-2766 (2008); (2) S. Mouret, I. E. Grossmann, and P. Pestiaux, "A Novel Priority-Slot Based Continuous-Time Formulation for Crude-Oil Scheduling Problems," *Ind. Eng. Chem. Res.* 48, 8515–8528 (2009). In both of these publications, the vessel schedule (or the transportation schedule) and the raw material purchase decisions are given as input. Thus, these approaches do not apply to the simultaneous solution of raw material selection, transportation scheduling, and production scheduling.

SUMMARY

The present invention provides a method for planning (including scheduling) the operations of one or more production facilities. The production facilities can include one or more of the following: petroleum refineries, petrochemical refineries, chemical plants, or other manufacturing plants, or any combination of these, along with their related supply chains. The method uses a modeling approach that represents the operation of one or more production facilities, which can include transportation activities and inventory. The modeling approach handles situations where different production entities may operate on asynchronous schedules. The method can be used for various applications, including optimization or simulation of the production facilities.

A variety of planning activities can be modeled and solved by the present invention, including (a) feed material selection, including quantity and timing, (b) product sales, including quantity and timing, (c) process operations, including process conditions and timing, (d) blending operations, including process conditions and timing, (e) transportation to and/or from facilities, including transportation modes, quantities, and timing, and/or (f) inventory management, including inventory movements and timing, inventory limits, and inventory quantities over time. In one embodiment, the method can be used to optimize: (i) feed material selection, (ii) transportation scheduling, and (iii) production planning (including production scheduling), as a combined problem.

In one aspect, the present invention provides a method for determining the operation of a production facility. The method uses a computer-based mathematical model of the production facility, wherein the mathematical model includes a representation of two or more non-tank production entities and one or more tank production entities (i.e. tank entities) that are associated with (e.g. connected to, directly or indirectly; or upstream and/or downstream of) the non-tank production entities. For example, a tank entity may be downstream of a non-tank production entity by a connection that is direct or indirect (via an intermediate equipment); and may be upstream of another non-tank production entity by a connection that is direct or indirect (via an intermediate equipment).

Each non-tank production entity is represented by a corresponding submodel comprising a set of mathematical relationships (given as equations) that model the behavior of the non-tank production entity. The submodel represents the non-tank production entity in each operational time interval of the non-tank production entity. In one embodiment, the number of equations contained in a submodel of the non-tank production entity is related to (i.e. having a mathematical relationship to, such as proportional or equal to) the number of operational time intervals of that non-tank production entity.

The number of operational time intervals for the each non-tank production entity may be received as input data (e.g. directly by the user, or from a database, table, or spreadsheet) or calculated by the modeling tool using other inputted data. The submodel for each non-tank production entity may include decision variables relating to the operation of the non-tank production entity. These decision variables may include decision variables relating to the duration of the operational time intervals.

The tank entity is represented by a corresponding submodel comprising a set of mathematical relationships (given as equations) that model the behavior of the tank entity. The submodel for a tank entity represents the tank entity in each operational time interval of the tank entity. In one embodiment, the number of equations contained in a submodel of the tank entity is related to (i.e. having a mathematical relationship to, such as proportional or equal to) the number of operational time intervals of that tank entity. The number of operational time intervals for the tank entity is calculated using the number of operational time intervals of the non-tank production entities which are associated with (e.g. connected to) the tank entity. This calculation can be performed in any suitable way to reflect how the behavior and/or operation of the tank entity is affected by its relationship with the associated non-tank production entities. In some cases, the calculation may yield the maximum number of operational time intervals that would be needed to represent the tank entities and the operational time intervals of the associated non-tank production entities, as further described below.

The approach described above is used to model the production facility(s). One advantage of the approach for handling operational time intervals is that it can reduce or minimize the number of time intervals that are considered while allowing for optimization of the operations with time. An objective function is defined based on one or more performance metrics for the production facilities. The resulting mathematical model is solved using one or more computers to obtain a solution. The solution results are used to determine an operational plan for the production facility, including the operating schedule for the production entities. In some embodiments, the method further comprises operating the production facility according to the operational plan (including operating the production entities, and optionally, the associated supply chain).

In certain embodiments, the mathematical model may be formulated as an optimization model, which comprises one or more objective functions for a performance metric of the production facility. The objective function(s) may include terms from the submodels, such as quantities (e.g. feed material consumption, production, etc.) and composition (properties, qualities, etc.) that contribute to the performance metric. The mathematical model is solved for maximizing or minimizing the performance metric. For calculating the performance metric, the mathematical model may comprise various cost-related parameters, including parameters relating to the cost of feed materials and parameters relating to the cost of holding inventory. For making decisions based on the performance metric, the mathematical model may comprise various decision variables, including those related to the selection of feed materials. In some cases, the mathematical model further comprises parameters relating to the cost of transportation options and decision variables relating to transportation scheduling. The model may comprise decision variables related to quantities (e.g. quantity of each feed to purchase), properties (e.g. the physical properties of a product stream), rates (e.g. flowrate of a feed stream), and/or temporal decisions (e.g. the delivery schedule for feed materials).

In some embodiments, the modeling methodology of the present invention handles situations where the operational time intervals for two or more of the non-tank production entities are asynchronous. One of the roles of the tank entities is to handle the asynchronous operational time intervals of non-tank production entities. For example, the tank entities may have time intervals which align with the time intervals of the associated non-tank production entities. To define how the time intervals of the tank entity align with the time intervals of the non-tank production entities, the mathematical model may further comprise binary variables, continuous variables, and/or mathematical relationships representing the relationships between the operational time intervals of the tank entities with the operational time intervals of the non-tank production entities.

The present invention may also be embodied as a computer-readable storage medium having executable instructions for performing the various processes as described herein. The storage medium may be any type of computer-readable medium (i.e., one capable of being read by a computer), including non-transitory storage mediums such as magnetic or optical tape or disks (e.g., hard disk or CD-ROM), solid state volatile or non-volatile memory, including random access memory (RAM), read-only memory (ROM), electronically programmable memory (EPROM or EEPROM), or flash memory. The term "non-transitory computer-readable storage medium" encompasses all computer-readable storage media, with the sole exception being a transitory, propagating signal.

The present invention may also be embodied as a computer system that is programmed to perform the various processes described herein. The computer system may include various components for performing these processes, including processors, memory, input devices, and/or displays. The computer system may be any suitable computing device, including general purpose computers, embedded computer systems, network devices, or mobile devices, such as handheld computers, laptop computers, notebook computers, tablet computers, and the like. The computer system may be a standalone computer or may operate in a networked environment.

BRIEF DESCRIPTION OF THE DRAWINGS

FIG. 1 shows an example of two process units of a refinery having asynchronous time intervals.

FIG. 2 shows an example of two process units of a refinery having synchronous time intervals.

FIG. 3 shows an example of two process units of a refinery having asynchronous time intervals and the combined time intervals.

FIG. 4 shows an example with two process units and a tank in between.

FIG. 17 shows the time intervals for tank CRUDE2 in the oil refinery of FIG. 16.

FIG. 18 shows an example of asynchronous intervals in a time horizon divided into discrete-time intervals of uniform duration.

FIG. 19 shows an example of synchronous intervals in a time horizon divided into continuous-time intervals of non-uniform duration.

DETAILED DESCRIPTION

Figure 4:
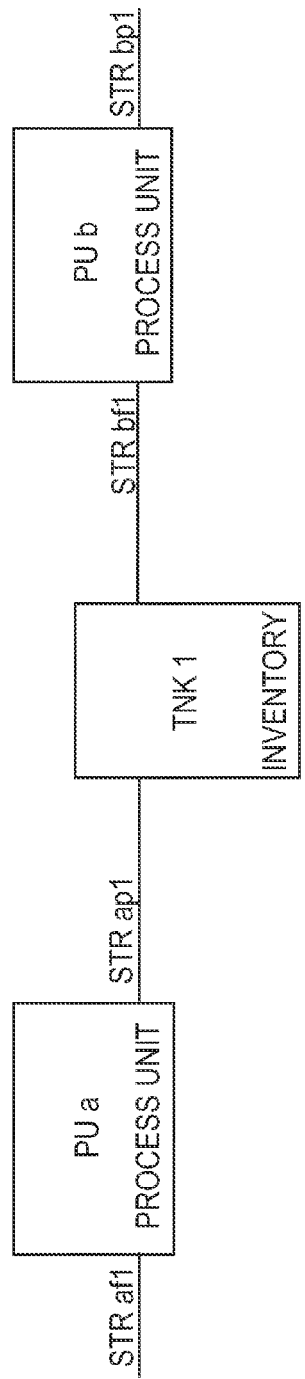

At a production plant, feed materials (including raw materials, such as crude oil, and intermediate materials) are fed into production equipment as steps in the production of desired products. The modeling tool of the present invention can be used to assist in planning the operations for the production plant, including determining the process operations and the scheduling of these process operations. Operational planning may be performed over any given time horizon and may involve the selection of feed materials, scheduling the operation of production entities, determining the operation of production entities (including product blending), scheduling transportation, making product sales decisions, and/or managing inventory. The modeling tool may consider one or more of these activities as a unified problem to determine an optimized operational plan. For example, the modeling tool may treat the feed material selection, production scheduling, and transportation scheduling as a unified problem. In other examples, the modeling tool may combine the following activities:

production scheduling and transportation scheduling;
production scheduling and process operations;
feed material selection and transportation scheduling;
feed material selection, production planning, and transportation scheduling;
feed material selection, production planning, and production scheduling;
feed material selection, production planning, and production scheduling, and transportation scheduling.

Alternatively, one or more of these may be treated as separate, sequential activities. Activities that are not included in the overall model may be provided as given decisions in the model. For example, the tool may optimize production scheduling and transportation scheduling for a given set of feed materials and product sales decisions; or optimize the feed material selection and transportation scheduling for a given production schedule and inventory determination.

The modeling tool of the present invention can be used for operational optimization or for simulation of the production facilities. When used for optimization, the modeling tool may optimize the operational planning according to any of various performance metrics, including production metrics (such as plant equipment utilization, production quantity, or production time) or economic metrics (such as operating cost or net profit). Whether the modeling tool will seek to minimize or maximize the performance metric will depend upon the type of performance metric that is being quantified. Generally, for materials cost and operating cost, the modeling tool will seek a minimize the performance metric. Generally, for the performance metric of net profit or production quantity, the modeling tool will seek to maximize the performance metric.

Each production facility comprises one or more production entities, which can be any equipment associated with a production facility that produces, consumes, stores, transforms (e.g. converts), separates, combines, or transports materials being handled by the production facility. In the case of a refinery, some examples of such physical production entities are process units (e.g. crude distillation units, catalytic cracking units, or hydrocracking units), tanks, blending units (or blenders), reactors, separation units, mixers, and splitters. The production entities may also be activities that represent, in a virtual sense, supplies into the production facility, products out of the production facility, or transportation or movement of materials being handled by the production facility. Some examples of such activities include purchases, sales, and transportation (e.g. maritime shipping, rail, truck, pipeline, etc.) of materials being handled by the facility. (Production entities may also be referred to herein as "operational entities." The term "production entity" is intended to be used interchangeably with "operational entity," but the term "production entity" is preferred because it may be less confusing. For example, the phrase "operation of operational entities" may be confusing because of the repeated occurrence of the root word "operation.") The production entities may be modeled using any suitable modeling technique, including those conventionally used in period-average models. These production entities may be represented as one or more submodels within the overall model formulation of the problem. Such production entity submodels typically include decision variables relating to process conditions for the production entity (e.g. temperature of a refinery process unit, flow rates, quantities, etc.), process constraints (including limits or bounds), and other variables and equations needed to represent the process behavior.

Each production facility also includes one or more means (e.g. tanks) for storing materials being handled by the production facility. These storage tanks are connected, either upstream or downstream, to other production entities. The tank handles the interface between the production entities and may be subject to asynchronous process schedules of the adjacent production entities. The tanks can also handle inventory management in the production facility. The modeling tool can use any suitable model for the tanks, including those conventionally used to model tanks in a period-average planning model. The tank(s) may be represented as one or more submodels within the overall model of the problem. Such tank submodels typically include decision variables relating to the quantities of materials, the composition of materials (e.g. properties or qualities), or the in/out flow of materials, as well constraints for material balances and composition balances (including inventory limits or bounds), and other variables and equations needed to represent the tank behavior. The tank entities in the model may correspond to physical tanks in the production facility or may be virtual tanks which are used by the model to represent any holding or storage of materials in the production facility (e.g. between other production entities).

Operational planning is conventionally performed on a rolling monthly basis using a period-average model. In a period-average model, activities that are varying over a period of time may be approximated by the average over that period of time. Period-average models generally assume that all activities occur simultaneously throughout the time period, rather than representing distinct operating blocks which occur at specific times. Thus, process unit models in a conventional production planning model are independent of time, with the model variables and constraints being representative of an average day of operation during the time horizon. For example, consider a single-period planning model that is used over a 30-day time horizon (e.g. for the month of August) with a certain process unit being out of service for 15 days. A period average model may use the average capacity of this piece of equipment over the 30 days rather than representing the capacity of this equipment for two distinct 15-day periods when the equipment is in-service or out-of-service. For example, if the standard capacity of this process unit is 200 units per day, under this practice, the process unit capacity is pro-rated to reflect the average capacity during the month such that the unit capacity could be defined as: 200 units/day*((31−15) days/31 days)=103.2 units/day.

Unlike a period average model, the modeling tool of the present invention divides the time horizon into multiple time intervals corresponding to different operations of the production entities in the production facility. The scheduling of process operations for the production entities is performed on the basis of time intervals that are specific to the individual production entity. The scheduling of other activities, such as purchases or sales, is also performed on the basis of the time intervals that are specific to the individual production entities. Inventory level calculations in the tanks provide the interface between other production entities which can have asynchronous schedules. Within each time interval, by definition the process unit operation are constant. Although in real practice, the operations will vary during a given interval because it is normally not possible to maintain an exactly constant operation. But for the purposes of modeling, the operations will be considered to be constant during each interval. Within each time interval, some of the tank variables may take period average values (e.g. the rate of flow into or out of a tank), while the value of other tank variables (e.g. the quantity of material) may change throughout the time interval.

With this framework, the overall production schedule can be considered a series of production runs, with each production run representing a distinct operating block for a production entity. For each production run that is considered, the schedule may set the start and end time, and the process operation(s) during that period of time. As such, the mathematical model includes decision variables relating to the process operations for each time interval.

The time horizon may include multiple production runs, each being individually handled by the model. The different production runs of a production entity can be represented individually by considering each production run as a separate model of the production entity. For example, each production entity submodel can be included N times in the overall model, where N is the number of time intervals for the production entity. Thus, each time interval may have its own decision variables relating to process conditions for the production entity (e.g. operating condition degrees of freedom for a particular process unit), process constraints (including limits or bounds), and other variables and equations needed to represent the process behavior. To allow each production entity to have different time intervals and different schedules as preferred, each time interval may have decision variables relating to the parameters of the time interval (e.g. interval duration, interval start time, interval end time, etc.).

The overall production schedule may be represented as a task of determining the sequence and timing of the production runs. The decision variables in this model can provide a set of detailed instructions for operating the production facility, including the operation of the production entities. In making a production schedule, the inventory of raw materials, intermediate materials, or finished products and changes thereof may be considered. Other constraints and limitations may be considered within the scheduling process. Additional elements of production scheduling that may be included in the optimization problem are stream line-ups, unit operating signals, unit marginal capacity economics, tank inventories, product shipment timing, blend recipes, timing of blocked operations, operating instructions, material delivery, arrival timing, and onshore inventories.

During the operation of a production facility, the inventory levels in the tanks can vary over time. Whereas conventional planning models may ignore these inventory dynamics in the tanks, the optimization tool of the present invention may consider the need for inventory management and changes in inventory levels in the tanks for determining an optimized production schedule. Inventory levels may enter into the economic calculations made by the model through inventory holding costs and cost penalties for failing to satisfy inventory management criteria. The model may also have constraints relating to inventory levels. For example, the model may include minimum and maximum inventory limits, which can be defined as hard limits (which should not be exceeded), or as soft limits which can be exceeded at a certain cost or penalty, or both. Thus, with these constraints and cost factors, the optimization tool can be used to minimize overall capital costs (including inventory costs and inventory level penalties) while maintaining inventory levels within a desired range (e.g. minimum and maximum limits on inventory) and maintaining other production constraints. In addition to production scheduling, inventory feasibility may also need to be considered in other activities performed by the optimization tool, including transportation scheduling.

Figure 21:
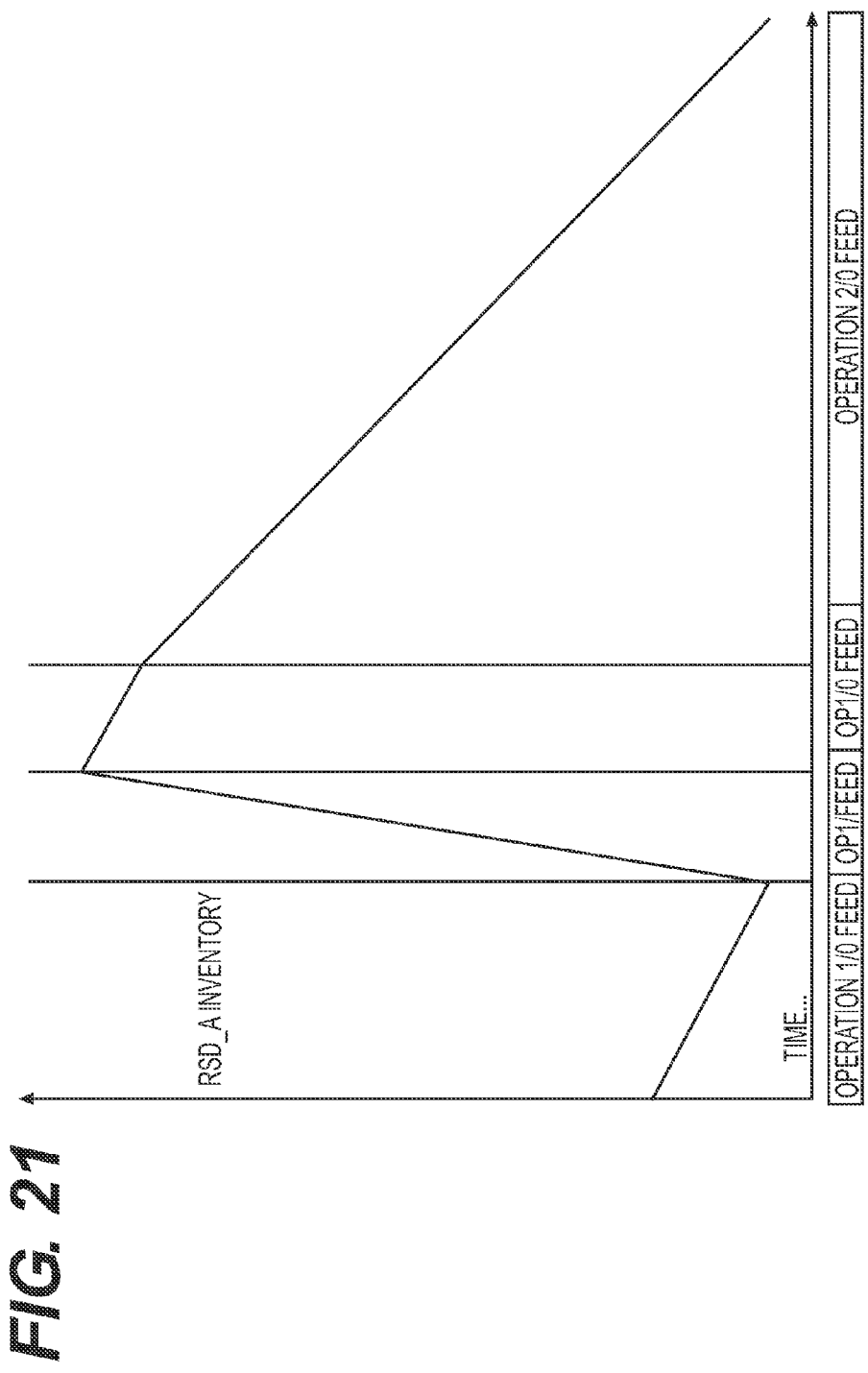
FIG. 21 shows a plot of inventory levels over time.

For example, FIG. 21 shows a plot of the inventory level for a tank (RSD_A) over time. This tank feeds a process unit, which has two operating modes. The plot has four regions (separated by the vertical dashed lines) to denote four different operations for the tank, as labeled at the bottom of the plot. The first three operations of the tank feed the process unit operating in the first mode, and the fourth operation of the tank feeds the process unit operating in the second mode. Inventory is consumed in the first operation, and then replenished in the second operation. In region three, inventory consumption continues as the material is fed into the process unit. Region four represents the switch to a faster consumption rate by the process unit as the process unit switches to the second operating mode. Because the rate of flow in or out is constant within each region, it is sufficient to determine the inventory level at the start and end of each region (or time interval). If the start and end inventory levels are known, then the inventory level at any point within the time interval can be determined. Also, it is sufficient to ensure that the inventory level at the start and end of each time interval are within the allowed inventory limits (e.g. minimum and maximum levels), since each point in time within the time interval will also be within the allowed limits.

The tool of the present invention may consider the composition (e.g. properties or qualities) of a blend (including mixtures) of two materials. The composition of the blended material may be determined by linear blending rules, in which the composition is a linear relationship with the relative quantity of each individual material; and vice versa, the relative quantity of each individual material in the blend is determined from a linear relationship with the composition of the blended material.

Whereas conventional planning models may determine a facility operation plan based on a given (i.e. pre-determined) recipe of raw materials, the optimization tool of the present invention may include the selection of feed material (including type and quantity) in determining an optimized production plan. Selection of feed materials may enter into the economic calculations made by the optimization tool based on the monetary valuation of the feed material in the production process. Valuation of feed materials involves determining the economic value of the feed materials and various alternatives to the feed materials. There may be options available for feed material selection, potentially having different purchase prices, available quantities, and material characteristics. These options for feed material selection may be represented as decision variables in the model (e.g. for quantity, type or composition, allocation of feed materials to different production streams, and delivery scheduling).

Valuation of feed materials can be based on an assumed purchase price, a specific quantity, and the use of the feed material in a production facility. Feed material valuation can pertain to both the quantities determined in feed material selection (e.g. optimal quantities) and raw material quantities for various feed material alternatives. The feed material may be characterized in various ways, depending upon its type. For example, feed material characterization can be the values of a set properties or qualities for a given feed material.

The economic valuation of feed materials can be based on transportation scheduling, production scheduling, and production processing considerations (e.g. yields, capacities, constraints, etc.). For determining feed material selection on the basis of its valuation in production planning, the optimization tool may receive various input data about the feed materials, including the purchase prices, minimum and maximum available quantity, and physical characterization. Other factors that may determine the valuation of the feed material include its composition characteristics such as its qualities and physical properties (which can be received as input), how the feed material is processed, and other factors such as production capacity.

In general, the value of a feed material is also a function of the quantity selected. Furthermore, it may be desirable to also determine the feed material value associated with an incremental quantity. For example, consider that the optimal quantity for raw material A is equal to 100 units. The solution of a mathematical programming model will often include marginal values which can be interpreted as the economic value for a small perturbation from the optimal quantity. But marginal values do not necessarily represent the economic value for a larger perturbation in the quantity. Feed material purchase decisions can be supported by having information about the economic impact of certain quantity perturbations of the feed material purchases. Feed material valuation provides the economic values for raw material quantities and various alternative feed material quantities.

In situations where the feed material selection activity is separated from the production planning and scheduling activity, the subsequent production runs might have been ignored. Thus, the corresponding production plan or approximate production runs might exceed what can be achieved when specific production runs are considered. For example, two or more production runs may need to occur sequentially during the actual production, but the model approximation might assume that these two runs occur at the same time or share the same equipment.

Once the feed material selections are separately made, the production scheduling step is typically less complicated than considering both problems simultaneously. One practice is to hold the feed material purchase decisions constant, and then execute the production run planning Then, in production runs planning, the best production operations are determined for each production run. This activity involves more rigorous treatment of the production runs, and the corresponding production runs plan should provide an acceptable representation of the production runs capability. In general, there can be multiple production runs occurring during the time horizon under consideration. However, one disadvantage of performing these activities separately is that the feed material selection, which has already been determined, may not be optimal when the production runs are considered.

The production facility may interface with transportation activities for receiving feed materials (e.g. raw materials and intermediate materials) and dispatching of finished products. As such, in certain embodiments, the optimization tool may include transportation scheduling for materials in and out of tanks in determining an optimized production plan. Transportation scheduling is the scheduling of activities for moving feed materials (including raw materials and intermediate materials) to the production facility and moving product materials out of the facility (including final products and intermediate materials). For water-bourne vessels, this can include the vessel route and the schedule for loading and discharging cargo. Various transportation mode options, effective utilization of transportation vehicles, and transportation costs can be considered.

The transportation schedule sets the time, quantity, and/or itinerary. Transportation costs can impact the selection of raw materials, product slates, etc. Also, the transportation costs associated with a given transportation schedule may be quite different from assumed transportation costs. There can be different transportation mode options (e.g. ship, pipeline, rail) and within each transportation mode, there can be different transportation vehicle choices (e.g. size of ships to be used, which specific ships to use for certain transportation tasks). The solution provided by the modeling tool may include the minimization of transportation costs (e.g., total transportation costs or transportation costs per unit amount of material).

Additional elements of transportation activities that may be included in the optimization problem are cargo size, load port rotation, discharge port rotation, load timing, arrival timing, and onshore inventories. Distribution activities may also be included, such as optimum supply terminal selection and optimum supply of retail customers. The various elements of transportation scheduling (including time, quantity, itinerary, transportation mode, transportation vehicle, or routing) may be represented as decision variables in the model.

The modeling approach formulates a problem over multiple time intervals spanning a time horizon of interest. The modeling tool may use any suitable approach for determining and representing these multiple time intervals. The terms "time interval" and "time period" are used interchangeably herein. For example, the modeling tool may use a discrete-time representation, in which the time horizon is divided into intervals of a fixed duration (i.e., they are defined in advance). For example, a 30-day time horizon can be represented by using thirty 1-day time intervals or three 10-day time intervals. The length of the fixed durations can be the uniform, but this is not required. For example, a 30-day time horizon can be represented by using fifteen 1-day time intervals and one 15-day time interval. In another example, if the time horizon is the month of August, then one can subdivide August into: the 31 days of the month; or 8 hour time periods running from 12:00 am-8:00 am, 8:00 am-4:00 pm, and 4:00 pm-2:00 am on each of the days of the month; or 8 hour time periods during the first 10 days of the month and 1 day periods during the remaining 21 days of the month; or 1 hour periods for each of the 31 days in the month; or other possible schemes to represent a 31 day time horizon. One drawback of this approach is that shorter time periods are needed to obtain a finer resolution of time, which leads to a larger number of time periods and a larger size problem to be solved.

In an alternate embodiment, the modeling tool may use a continuous-time representation, in which the time horizon is divided into intervals of variable duration. In this approach, time is represented using variable time period durations rather than fixed time period durations. By using a continuous time modeling approach, a pre-determined time grid is not needed to represent the time horizon. For example, a 30-day time horizon can be represented by three time intervals of variable duration with the sum of the three time intervals being the total duration of the time horizon. In this approach, the duration of the time intervals are decision variables in the model. Typically, the length of the time intervals are different, but this is not a necessary requirement. However, having decision variables for time interval does not limit the modeling tool to using a continuous-time representation. For example, by simply fixing the values of these decision variables, the time horizon is effectively divided into intervals of fixed duration (i.e. discrete-time representation).

Using a continuous-time representation can allow for the operational scheduling of the production entities to be performed using a fewer number of time intervals, which allows problems of a larger scale to be feasible solved. For example, in a discrete-time representation, a one-month (e.g. 30 days) time horizon with hourly schedule resolution could result in 30*24=720 time intervals. In contrast, by using a continuous-time representation, a given production entity might have a limited number of process operations (e.g. 1–10) during a one-month time horizon. While it is impractical to solve a multi-period production planning model with hundreds or thousands of time periods, it is much more practical to handle a multi-period model with significantly fewer time periods.

The following gives an example comparing discrete-time representation to continuous-time representation. In this example, the task is to schedule a single delivery of raw material during August where the scheduling decision is the hour and date of the delivery. Using discrete-time representation, one approach is to divide the time horizon into 31*24 or 744 time periods to represent the hours during the 31 days in August. A corresponding model could be used to determine the optimal delivery schedule by identifying the period (1 through 744) when the delivery should be made. Assume that this raw material is to be delivered into a particular tank, and that there is a constant consumption rate from this tank during the month of August such that the tank content is consumed at a rate of 1 unit per hour. Thus, in each of the 744 periods, the tank content is reduced by 1 unit per hour, and in 1 of the 744 periods, the tank content is replenished with the raw material delivery. For each period (denote as period t, for t=1 to 744), the following equation can be used to model the tank content:

$$\text{Inventory}(t) = \text{Inventory}(t-1) - \text{Consumption}(t) + \text{Delivery}(t) \quad \text{Eqn 1.}$$

For t=1, 2, 3, ... 744; where Consumption(t)=1 unit/per hour; and Delivery(t)=0 for all but 1 of the 744 periods, since the delivery schedule is unknown the model must represent all the options for the delivery.

Alternatively, using continuous-time representation, consider time=T* as representing the delivery timing. Only three model equations are required to represent the inventory level throughout the time horizon:

$$\text{Inventory}(T^* - eps) = \text{Inventory}(0) - \text{Consumption}^*(T^*) \quad \text{Eqn 2}$$

$$\text{Inventory}(T^*) = \text{Inventory}(T^* - eps) + \text{Delivery}(T^*) \quad \text{Eqn 3}$$

$$\text{Inventory}(Tfinal) = \text{Inventory}(T^*) - \text{Consumption}^*(Tfinal - T^*) \quad \text{Eqn 4}$$

Eqn 2 calculates the inventory level just prior to the delivery (time=T*−eps) as the starting inventory level minus the consumption rate times the length of time prior to the delivery. Eqn 3 calculates the inventory level just after the delivery occurs (assuming that the delivery occurs in an instant). Eqn 4 calculates the inventory level at the end of the time horizon as the inventory level at time T* minus the consumption rate times the length of time between the end of the time horizon and the timing of the delivery. Eqn 3 can be modified to account for the amount of time needed to discharge the material into the tank. It is evident that the continuous-time approach requires far fewer model equations in this instance. Also, in the continuous-time approach, the schedule delivery timing can be calculated as any time during the time horizon (e.g. 11:45 am on August 13), whereas in the discrete time approach, the delivery timing is determined to the nearest hour (since the discrete-time period duration was chosen to be one hour).

The production entities in a production facility may interact with each other (e.g. the output from one production entity becomes the input for another production entity) and this requires coordination between the production entities. The interaction between the operational entities may also be indirect (e.g. through an intermediate storage tank). Different production entities can operate on different schedules and the schedule of a given production entity can impact other production entities. The number of intervals into which the time horizon is divided will depend, in part, upon whether the production entities operate in a synchronous or asynchronous manner.

If the production entities being considered in the model operate in a synchronous manner, then the modeling tool can use one common set of time intervals for the production entities. This can apply to either discrete-time representation or continuous-time representation. For example, for a 30-day time horizon, if the operation of process unit A is modeled using thirty 1-day time intervals, then the operation of process unit B is also modeled using thirty 1-day time intervals.

If the production entities being considered in the model operate in an asynchronous manner, then the production entities in the model do not necessarily use a common set of time intervals. For example, in a model using asynchronous time intervals over a 30-day time horizon, the operation of process unit A can be modeled using thirty 1-day time intervals whereas the operation of process unit B can be modeled using ten 3-day time intervals. For example, as illustrated in FIG. 1, consider a situation in which process unit PUa can be scheduled to change operations at two times during the time horizon and process unit PUb can be scheduled to change operations at three times during the time horizon. These two process units may have interactions (e.g. the product from PUa can be a feed to PUb) and the schedules for these two units can be asynchronous. An asynchronous time period modeling approach can be applied to this type of problem.

The modeling tool configures the time intervals based on the number of distinct operational blocks of the production entities. This allows the modeling tool to be capable of handling either synchronous or asynchronous time intervals. This can apply to either discrete-time representation or continuous-time representation.

The time modeling approach used by the modeling tool (e.g. continuous-time, discrete-time, asynchronous time periods, synchronous time periods, and combinations of these various approaches) will depend on various considerations, such as the size of the problem, the interactions between the production entities, and the level of detailed needed. Combining different activities as a single, integrated problem can provide better results than considering the activities separately in sequential fashion. However, combining different activities increases the size of the problem, making the problem more difficult or impractical to solve. The continuous-time modeling approach used in this invention can reduce the overall number of time intervals that need to be considered.

In certain embodiments, to make the problem tractable and to have the capability of handling asynchronous operations, the time horizon is represented in asynchronous time intervals with a continuous-time representation. With a continuous-time representation in a production scheduling model, the production entities of the production facility can have suitable scheduling time intervals while still managing inventory feasibility and/or optimizing inventory at the boundaries of the process units. In addition, the methodology combines an existing approach for transportation scheduling (as mentioned above) with the new production scheduling approach to enable combining of production and transportation scheduling. The methodology also provides the ability to combine feed material valuation and selection with production planning (and scheduling).

For example, consider a refinery having two process units PUa and Pub, where the output (i.e. product) from PUa is the input (i.e. feed) to PUb. During a given time horizon, the operation of each unit may change, defining a process unit schedule. In the FIG. 2, the operations for PUa and PUb are synchronized such that there is a common schedule for each new operation of PUa and PUb.

Let internal operations denote the different production entity operations that may occur as a result of factors which are associated with a given production entity, and external operations denote different production entity operations that may occur as a result of factors which are not associated with a given production entity. Rigorous treatment of the time horizon would consider each time interval and the potential change in conditions or operations which occurs at the start the time intervals. The most comprehensive set of time intervals for a given production entity includes the intervals defined by both internal operation changes and external operation changes. Process unit Pub has different operations at three operating intervals: PUb1, PUb2, and PUb3. Because the product from PUa is a feed for Pub, the operations of PUa (PUa1, PUa2, and PUa3) impact PUb. Since the operations for PUa and PUb are synchronized, the minimum number of required time intervals is three.

Consider a different example where process units PUa and PUb have asynchronous process schedules as shown in FIG. 3. During the operation of PUb2, there are three external operations which impact PUb: PUa1, PUa2, and PUa3. While the minimum number of intervals required to represent the operations of process unit PUb is four, additional intervals are required to reflect the impact of PUa on PUb since the operational changes between the two units are not synchronized. The maximum number of required intervals in this instance is six, as can be seen in FIG. 3 since the interval for PUb2 would be subdivided into three intervals. To demonstrate how the asynchronous operations affect the number of time intervals needed, consider the example where the change from PUa2 to PUa3 occurred at the same time as the change from PUb2 to PUb3. In this example case, one less interval (five instead of six) would be required. In general, the maximum number of intervals will provide an adequate number of intervals to represent the effect of the time intervals for all the associated entities. The maximum number of time intervals for a tank entity can be calculated using Eqn 5 below. In this simple example: maximum intervals for PUb=(4−1)+(3−1)+1=3+2+1=6.

$$\text{maximum required intervals} = \dfrac{\text{sum over external entities which impact a given tank entity}}{+1} \{\text{number of external entity intervals} - 1\} \qquad \text{Eqn 5}$$

The modeling approach used in this invention is designed to handle situations where two or more production entities operate asynchronously. This approach can also handle the special case of production entities that operate synchronously. The case of synchronized production entity schedules is conceptually simpler since the scheduling intervals will match the process operations internal intervals. As such, this situation is handled in a straightforward manner as follows: maximum required intervals for synchronous schedules=number of internal operation intervals.

If all the production entities in the production facility are synchronized, then one common set of time intervals can be used for the production facility. Additional constraints are required to ensure that the duration of each given time interval is the same for all process units. Under this condition, the asynchronous continuous-time representation will simplify to a synchronous continuous-time representation.

As illustrated in FIG. 4, consider a portion of a production facility that has two process units (PUa and PUb), one tank (TNK1), and streams (STRaf1, STRap1, STRbf1, STRbp1) associated with the tank and process units. The flows of material is from left to right such that:

stream STRaf1 is the feed to process unit PUa;

stream STRap1 is the product from process unit PUa and the feed into tank TNK1;

stream STRbf1 is the product from tank TNK1 and the feed to process unit PUb;

stream STRbp1 is the product from process unit PUb.

For the case where there is no tank (i.e. no inventory storage) between PUa and PUb, the flowrate of stream STRap1 can be set equal to the flowrate of stream STRbf1. In general, the flowrate of streams STRap1 and STRbf1 can be different, and the level (inventory quantity) of tank TNK1 can vary over time. If the process schedules for process units PUa and PUb are asynchronous, then the flowrate of streams STRap1 and STRbf1 can be different during each of the process operations of units PUa and PUb, respectively. The case where process units PUa and PUb are asynchronous is illustrated in FIG. 5, in which the flowrate for STRap1 is shown (using the vertical axis to denote the magnitude of the flowrates throughout the time horizon) with the solid line and STR bf1 is shown with the dashed line.

As shown previously in FIG. 3, process unit PUa has the 3 time intervals and process unit PUb has 4 time intervals, and these two sets of time intervals are asynchronous. The maximum number of time intervals required for the tank TNK1 is calculated as follows using Eqn 5: number of intervals=(internal operational intervals for the tank−1)+sum of (number of operational intervals for adjacent production entities that impact the tank−1)+1. The two process units PUa and PUb impact the contents of tank TNK1 (including inventory level and/or composition) since the product from PUa is a feed to TNK1 and the product from TNK1 is a feed to PUb. Applying Eqn 5 to this situation, the maximum number of time intervals required for TNK1=(1−1)+(4−1)+(3−1)+1=6.

Figure 5:
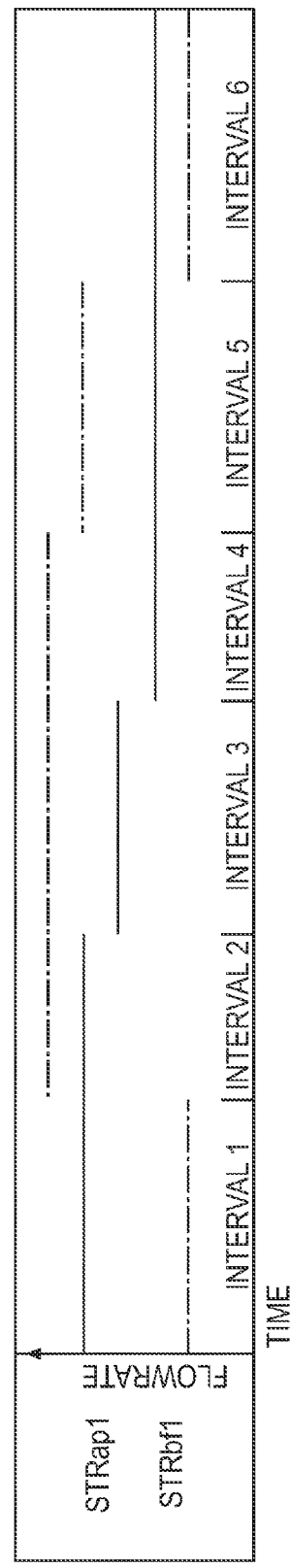
FIG. 5 shows an example of stream flowrates for two asynchronous process units.

FIG. 5 illustrates these time intervals for TNK1 with each of the five vertical tick marks identifying the boundary between time intervals. The tank inventory must be calculated at the end of each time interval in order to adequately represent the behavior of tank TNK1. Note that during each time interval, the operation is assumed to be constant. In other words, the flowrate of streams STRap1 and STRbf1 remain constant during each of the six time intervals of the tank, but the flowrates can change from one time interval to the next. This condition is necessary in order to properly calculate the tank inventory level:

| TNK1_level(i) = | TNK1_level(i−1) <br> + STRap1_flowrate(i) * Duration(i) <br> − STRbf1_flowrate(i) * Duration(i) |
|---|---|

For each interval i, the tank inventory level at the end of the interval is equal to: the level at the end of the prior interval+(the flowrate feeding into the tank*the duration of the interval)−(the flowrate exiting the tank*the duration of the interval). The tank level can be expressed in any suitable quantity unit (e.g. tons, barrels, etc.) and the flowrate can be expressed in any suitable unit of quantity per time (e.g. tons/day, barrels/day, etc.). The duration of the interval is used to convert between flowrate and quantity. Note that in the case where there is no physical tank (no inventory storage) between PUa and PUb, then the inlet and outlet flowrates to the virtual tank are set equal to each other for each time interval. In this situation, the above equation would then simplify to: TNK1_level(i)=TNK1_level(i−1).

An interesting observation for the case with no inventory storage and asynchronous process unit schedules is as follows: STRap1_flowate(i)=STRbf1_flowrate(i), for all intervals i. In this case, referring again to the example shown in FIG. 5, tank interval 1 (i=1) corresponds to operation PUa1 and PUb1. Tank interval 2 (i=2) corresponds to Pua1 and PUb2. Therefore:

| | |
|---|---|
| STRap1_flowrate(1) = STRbf1_flowrate(1) | |
| STRap1_flowrate(1) = STRap1_flowrate(2) | Since interval i = 2 corresponds to operation PUa1 and thus the flowrate of product from PUa is the same as interval i = 1. |
| STRap1_flowrate(2) = STRbf1_flowrate(2) | |
| Therefore: STRap1_flowrate(1) = STRbf1_flowrate(1) = STRap1_flowrate(2) = STRbf1_flowrate(2) | |

Continuing with this logic through all the intervals in the time horizon:

| | |
|---|---|
| STRap1_flowrate(i) = STRap1_flowrate(i−1) | for all intervals i |
| STRbf1_flowrate(i) = STRbf1_flowrate(i−1) | for all intervals i |
| STRap1_flowrate(i) = STRbf1_flowrate(i) | for all intervals i |

Figure 6:
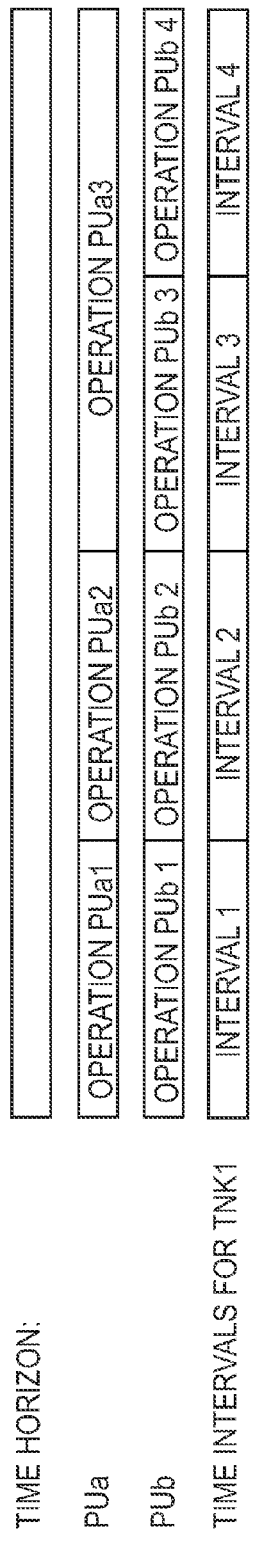
FIG. 6 shows an example of stream flowrates for two asynchronous process units with partially synchronized time intervals.

The statements above are based on the assumption that the process operations are asynchronous. It is also possible for the three operations for PUa to be synchronized with three of the four operations for PUb, in which case the flowrates for STRap1 and STRbf1 could change during intervals i, and still maintain that STRap1(i)=STRbf1(i). FIG. 6 illustrates this case of partial synchronization.

Thus, with this approach, the modeling tool is capable of handling synchronous, asynchronous, or partially asynchronous process operations for of the various activities in the operation of a production facility, including process equipment operations, feed material purchases, and product sales.

Figure 7:
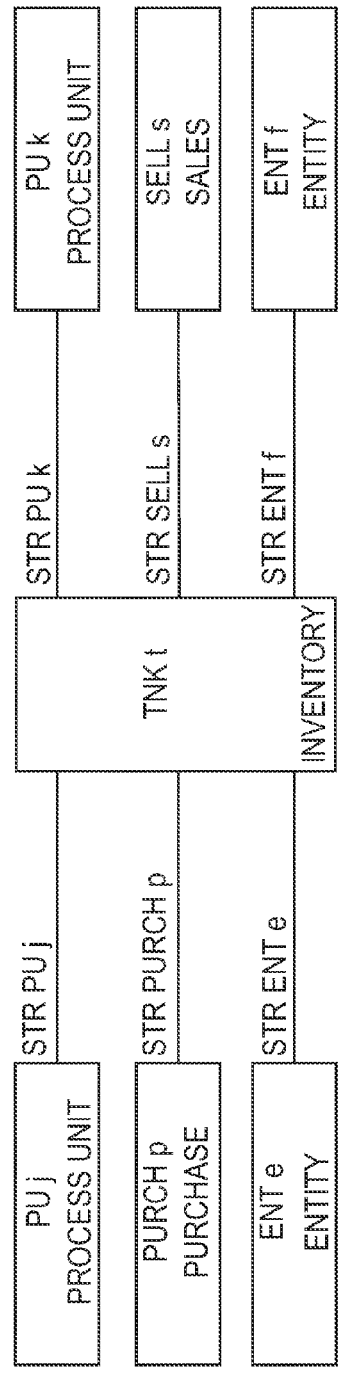
FIG. 7 shows a conceptual view of a tank interacting with production entities.

As explained above, the production entities can be any equipment of the production plant that produces, consumes, stores, transforms (e.g., converts), separates, combines, or transports materials being handled by the production facility. The production entities can also be activities that represent, in a virtual sense, supplies into the production facility, products out of the production facility, or transportation or movement of materials being handled by the production facility. Thus, the concept defined above for one tank with two production entities is readily extended to a more general case in which one tank has feed streams coming from other production equipment or purchases and product streams going to other production equipment or product sales. FIG. 7 shows examples of other production entities with which the tank may interact. The material purchases and the product sales can be on a rate basis (e.g. tons/day, barrels/day, etc.) or a quantity basis (e.g. tons, barrels, etc). The blocks shown as "entity" can be any of the production entities described above. The materials coming from or going into ENTe and ENTf can be on a rate basis or a quantity basis.

For FIG. 7, a material balance equation for tank TNKt is shown below:

Eqn 6.

TNKt_level(i) =
TNKt_level(i−1)
+ Sum over purchases: Q_PURCHp(i)           if PURCHp is on quantity basis
− Sum over sales: Q_SELLs(i)                if SELLs is on quantity basis
+ Sum over source entities: Q_ENTe(i)       if ENTe is on quantity basis
− Sum over disposition entities: Q_ENTf(i)  if ENTf is on quantity basis
+ Duration(i) *
( Sum over source process units: FR_PUj(i)  if PUj is on rate basis
− Sum over disposition process units:       if PUk is on rate basis
FR_PUk(i)
+ Sum over purchases: FR_PURCHp(i)          if PURCHp is on rate basis
− Sum over sales: FR_SELLs(i)               if SELLs is on rate basis
+ Sum over source entities: FR_ENTe(i)      if ENTe is on rate basis
− Sum over disposition entities: FR_ENTf(i) ) if ENTf is on rate basis } where "Q" denotes a quantity and "FR" denotes a flowrate.
Note:
the equation shown above does not include a quantity term for process units which are sources or dispositions, but this is readily handled by including Q_PUj(i) and Q_PUk(i) terms in the equation, similar to Q_ENTe(i) and Q_ENTf(i).

In addition to the material balance equation shown above, it may be desirable to model the composition of the material (e.g. properties or qualities) in the tank. The quality balance equation shown below applies when linear quality blending is assumed (i.e. the material qualities blend linearly on the basis of stream quantities):

Eqn 7.

TNKt_level(i) * TNKt_Quality(q, i) =
TNKt_level(i−1) * TNKt_Quality(q, i−1)
+ { Sum over purchases: Q_PURCHp(i) * PURCHp_Quality(q,   if PURCHp is on quantity
i)                                                        basis
+ Sum over source entities: Q_ENTe(i) * ENTe_Quality(q, i) if ENTe is on quantity basis
+ Duration(i) *
Sum over source process units: FR_PUj(i) * PUj_Quality(q, i)  if PUj is on rate basis
+ Sum over purchases: FR_PURCHp(i) * PURCHp_Quality(q, i)     if PURCHp is on rate basis
+ Sum over source entities: FR_ENTe(i) * * ENTe_Quality(q, i) if ENTe is on rate basis Where:
index i denotes time interval i for each term in the equation above,
TNKt_Quality(q, i) is the value of quality q in tank t,
PURCHp_Quality(q, i) is the value of quality q in purchase p,
PUj_Quality(q, i) is the value of quality q from process unit j, and
ENTe_Quality(q, i) is the value of quality q from process entity e.

As explained above, the modeling methodology of the present invention is capable of various approaches to representing time. The Asynchronous Continuous Time (ACT) approach provides a general capability to represent time intervals, which can be applied to various scenarios as explained below. With the ACT approach, time interval durations are model variables. By definition, each event (e.g. change in operation, etc.) occurs at the boundary of two time intervals, or within a time interval for situation where the timing of the event within the period does not matter (e.g. for a time interval where the flowrate into and out of a tank is zero and except for one or more discharge quantities which occur at any time within this time period). Thus, the time interval durations (model variables and degrees of freedom) will often correspond to the schedule for events. Examples of events include a change in operation for a process unit, a transfer or material into or out of a tank, etc.

A special case of ACT is one where time interval durations are known (given), and thus time period durations are not model variables. In the Asynchronous Discrete Time (ADT) approach, the time horizon is discretized into a given number of time periods of known duration. The duration of each period can take any positive value such that the sum of the period durations is equal to the time horizon. The equations, calculations, and features of ACT apply except that the period durations are known. Both time interval methods (the Internal Time Interval method and the Feed Entity Time Interval method) still apply. For example, given two process units with ADT based time intervals, the number of time intervals for a tank which receives material from one process unit and feeds material to the other process unit can be determined by Eqn 5. An example of this is illustrated in FIG. 18, which shows the CDU processing unit operating at fixed time durations of 3 time units (e.g. days) with a total of 10 interval periods over the time horizon. The CCU unit operates at fixed duration of 10 days with a total of 3 interval periods over the time horizon. Given the duration of each time interval for the two process units, the number and duration of the time intervals for the tank can be determined. For example, the VGO tank which receives material from process unit CDU and sends material to process unit CCU has 12 time intervals: [1+(3−1)+

(10−1)=1+2+9=12]. Many (e.g., eight) of the VGO tank time intervals have a duration equal to 3 time units, and the remaining 4 time intervals have a duration equal to 1 or 2 time units. The tank material balance equation (see Eqn 6) applies for ADT. In general, the time intervals for each entity are non-uniform (e.g. each time interval duration can be different), as shown in this example.

A special case of ADT is the situation where time interval discretization is common across all entities. For example, consider the case where all entities use a common discretization with time intervals durations of 1, 3, 2, 5, 9, 6, and 4 days (for 7 time intervals) as illustrated in FIG. 19. In these cases, the time intervals are synchronous since each entity uses a common time discretization. This time horizon discretization method will be referred to as Synchronous Discrete Time, or SDT. For SDT, Eqn 5 does not apply and the number of time intervals for an associated tank is equal to the common number of time intervals for all entities. The tank material balance equation (Eqn 6) applies for SDT.

Figure 20:
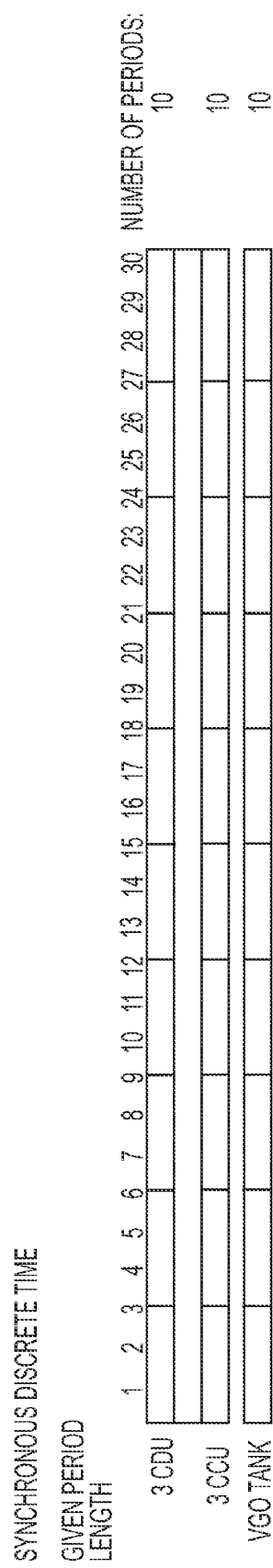
FIG. 20 shows an example of synchronous intervals in a time horizon divided into discrete-time intervals of uniform duration.

One additional special case is the situation where a uniform and common time interval discretization is used for all entities. For example, consider a 3-day time interval duration for 10 time intervals (see FIG. 20). This approach is the most widely used approach to define time periods in multi-period optimization models. This discretization approach will be referred to as Synchronous Uniform Discrete Time, or SUDT.

Since ADT, SDT, and SUDT are each special cases of ACT, it is also possible for one problem to be defined using a combination of these various approaches for representing the time horizon. For example, one portion of the problem could have a common uniform time period discretization (e.g. SUDT), and another portion of the problem can use ACT to represent the time periods. The tank model from ACT that handles the interface between two production entities which have asynchronous continuous time periods can also handle the interface between two production entities with asynchronous time periods where one entity uses continuous time period durations (e.g. where time period durations are model variables) and one entity uses a fixed time period discretization (e.g. where time period durations are known rather than being model variables). The methods and models as described for ACT are still applicable. The different methods for handling asynchronous and synchronous time periods would be applied to the portions of the problem which have asynchronous time periods and synchronous time period, respectively. Time period durations are model variables for production entities with continuous time periods, and time period durations have fixed values for production entities with known time period discretization.

Building upon the approach defined above, the methodology for handling time intervals and scheduling calculations is as follows. The scheduling of process operations for the production entities is performed on the basis of time intervals that are specific to the individual production entities. The scheduling of other activities, such as purchases or sales, is also performed on the basis of the time intervals that are specific to the individual production entities. Inventory level calculations in the tanks can provide the interface between other production entities (including the virtual production activities of purchases and sales) which can have asynchronous schedules.

Figure 8:
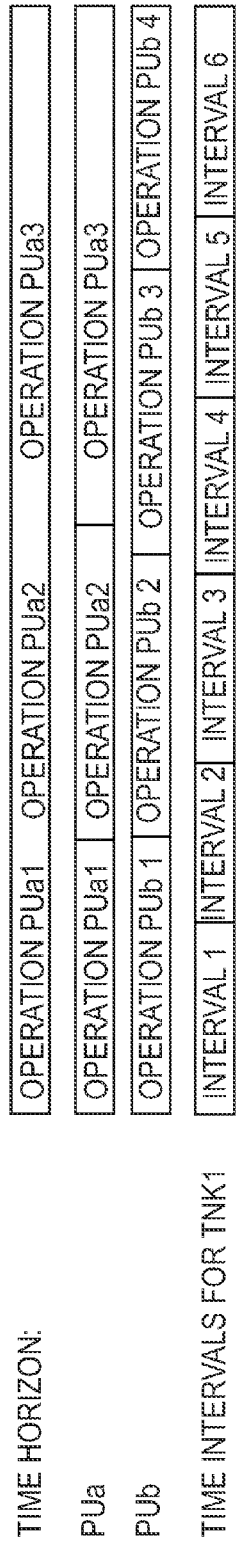
FIG. 8 shows an example of two process units with asynchronous time intervals and the corresponding time intervals for the associated tank.

Consider again the example shown in the FIG. 4, which includes two process units (PUa and PUb) and one tank (TNK1). If PUa and PUb each had one internal operation (e.g. one time interval), then the number of required intervals for TNK1 would be determined by equation Eqn 5, that is: (1−1)+(1−1)+1=1. Consider the alternate possibility that PUa and PUb do not each have one internal operation interval, but instead have 3 and 4, respectively. The number of time intervals by applying Eqn 5 is: (3−1)+(4−1)+1=2+3+1=6. The resulting time intervals are illustrated in FIG. 8. From the perspective of tank TNK1, these time intervals result from the fact that any operation change in PUa or PUb can change the flowrate of streams STRap1 or STRbf1. In order to account for each possible change in the flowrate of these two streams, it is necessary to have 6 time intervals.

From the perspective of process unit PUb, consider the concepts of internal and external operations. Process unit PUb has 4 internal operation intervals. This means that 4 different operations of PUb can occur during the time horizon, and these 4 operations are to be scheduled (timing) and optimized (determine the values of decision variables for PUb in each interval). Thus, PUb must have at least 4 time intervals. Focusing on the time interval which corresponds to operation PUb2 (see FIG. 8), note that process unit PUa will transition from PUa1 to PUa2 to PUa3 during the time interval for PUb2 (this is an observation made by considering the time intervals as shown in FIG. 8, but as the duration of the time intervals for PUa and PUb change, the interaction between PUa and PUb intervals will change). Consider that during the transition from PUa1 to PUa2 and PUa2 to PUa3, the flowrate from PUa into tank TNK1 can change. The impact of these transitions on the material balance is handled within TNK1. In addition, these transitions can also impact the composition (e.g. qualities or properties) of the content of TNK1. Again, tank TNK1 will handle the potential change in tank content composition (in each of the 6 time intervals). But the effect of the change in content composition in the tank can also impact PUb, since the performance of PUb may depend on the qualities of STRbf1 from tank TNK1.

Two possible situations must be considered for PUb. In the first situation, 4 time intervals are defined for PUb (based on the 4 interval operation intervals for PUb). Since there are 6 time intervals in TNK1, there are 6 potential changes in tank qualities which could affect PUb. Based on the time intervals shown in FIG. 8, the time interval corresponding to PUb2 is aligned with TNK1 intervals 2, 3, and 4. TNK1 quality changes between intervals 2, 3, and 4 would not be represented in PUb time interval PUb2. In the second situation, six time intervals are defined for PUb (based on the 6 time intervals for TNK1) such that the change in tank qualities during each TNK1 time interval is represented in PUb. Process unit PUb will require more time intervals (6 compared to 4).

Figure 9:
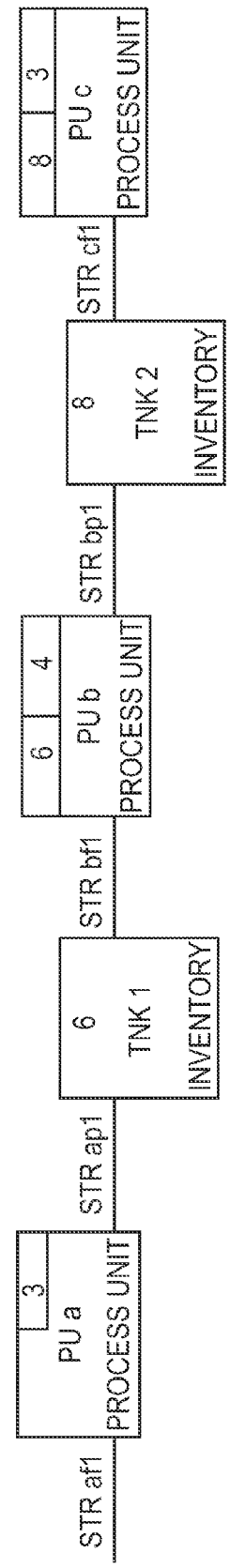
FIG. 9 shows an example of several process units and tanks with the associated scheduling time intervals calculated based on the Feed Entity Time Interval method.

The number of time intervals for PUb will also have an effect on other processes in the production facility. For example, consider TNK2 and PUc as shown in FIG. 9. In the upper portion of process units PUb and PUc there are two numbers. These numbers represent the number of total time intervals (the left-most numbers as shown in FIG. 9) and the number of internal time intervals (the right-most numbers as shown in FIG. 9), assuming that the total number of time intervals is based on the number of time intervals in the feed tank. If PUb has 6 time intervals, then tank TNK2 must have 8 (e.g. (6−1)+(3−1)+1) time intervals. As a result, PUc would also have 8 time intervals. By contrast, if the effect of feed qualities was ignored, then PUb would have 4 time intervals and PUc would have 3 time intervals.

Figure 11:
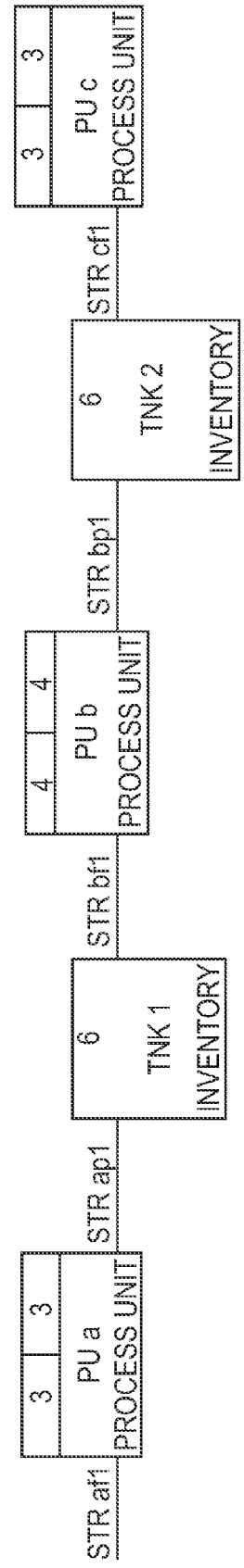
FIG. 11 shows an example of several process units and tanks with the associated scheduling time intervals calculated based on the Internal Time Interval method.

For each process unit, the two numeric values shown at the top of the rectangular block (e.g. 6 and 4 for PUb in FIG. 9; 4 and 4 for PUb in FIG. 11) denote the number of time intervals based on the tank entity feeding a process unit and the number of internal time intervals for this process unit. With the Internal Time Interval method, the number of time intervals is by definition equal to the number of internal time intervals, as seen in FIG. 11.

Figure 10:
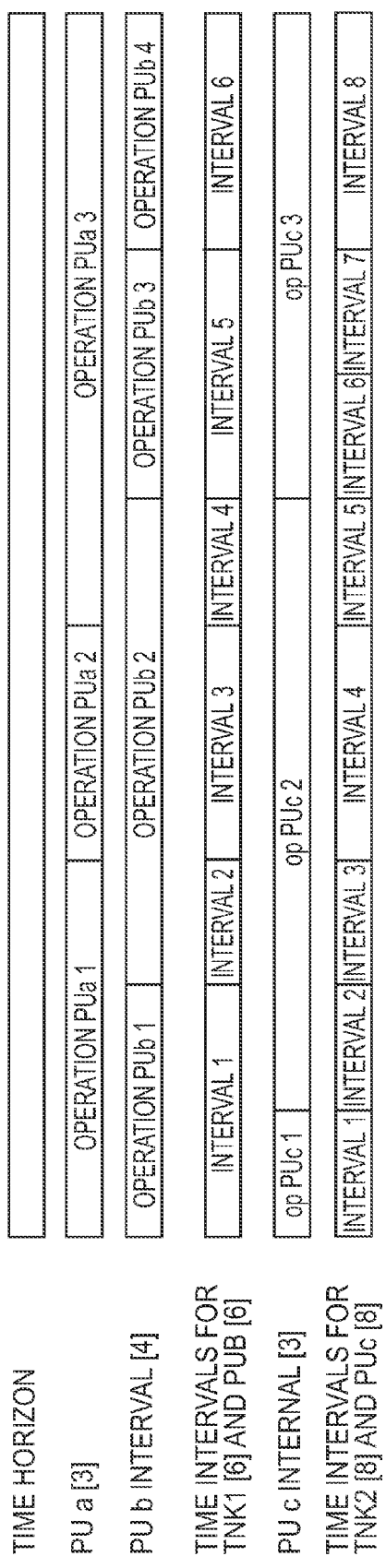
FIG. 10 shows an example of time intervals determined based on the Feed Entity Time Interval method.
Figure 12:
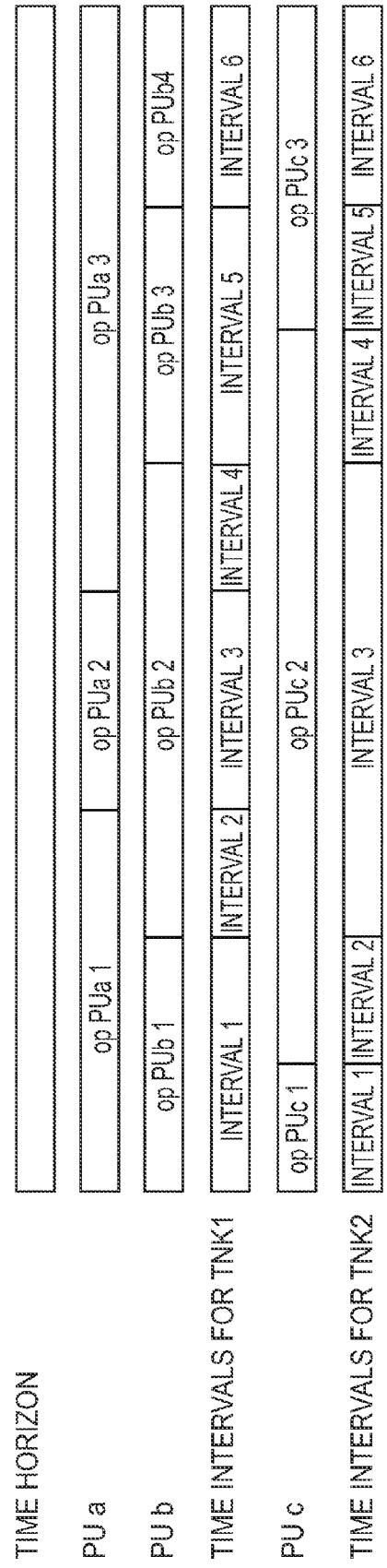
FIG. 12 shows an example of time intervals determined based on the Internal Time Interval method.

As described above, there are two choices for the number of time intervals to use for process units: (a) use the number of intervals of the tank (or other production entity) which feeds the process unit, or (b) use the number of internal operation intervals defined for the process unit. Method (a) will be referred to as the Internal Time Interval method, and (b) will be referred to as the Feed Entity Time Interval method. FIG. 9 illustrates the result of method (a), and FIG. 11 illustrates the result of method (b). FIGS. 10 and 12 illustrate the corresponding time intervals for methods (a) and (b), respectively.

As shown in FIGS. 10 and 12, using the Feed Entity Time Interval method results in a larger number of time intervals for units PUb (6 vs. 4) and PUc (8 vs. 3). When the Internal Time Interval method is used, PUc has only three time intervals whereas tank TNK2 has six time intervals. Time interval 2 for PUc (operation PUc2 in FIG. 12) is aligned with time intervals 2, 3, and 4 for tank TNK2. Since operation 2 for PUc does not have one unique corresponding tank time interval, the feed for process unit PUc during operation 2 can be approximated as the average or the blend of TNK2 time intervals 2, 3, and 4 (see equation below).

In some situations, the compositional characteristics of the content in tank TNK2 is not used in the process model for PUc, and thus no further action is required for PUc to handle the compositional characteristics from TNK2 during time intervals 2, 3, and 4. Since the compositional characteristics are readily calculated for TNK2 during time intervals 2, 3, and 4 (in fact, for all 6 time intervals), it is straightforward to have constraints or bounds on these compositional characteristics for each tank time interval. However, when the compositional characteristics of the content in TNK2 are used in the process model for PUc (which is fed by tank TNK2), then the average compositional characteristics over tank time intervals 2, 3, and 4 can be calculated as follows:

$$FR\_PUc(2) * TNK2\_Quality(q, 2) * Duration(2) + TNK2\_Quality(q, 3) * Duration(3) + TNK2\_Quality(q, 4) * Duration(4)$$
$$= FR\_PUc(2) * Avg\_PUc\_Quality(q, 2) * (Duration(2) + Duration(3) + Duration(4))$$

Or, dividing each side of this equation by FR_PUc(2) reduces the equation to:

$$TNK2\_Quality(q, 2) * Duration(2) + TNK2\_Quality(q, 3) * Duration(3) + TNK2\_Quality(q, 4) * Duration(4)$$
$$= Avg\_PUc\_Quality(q, 2) * (Duration(2) + Duration(3) + Duration(4))$$

Where:
Avg_PUc_Quality(q, 2) is the value of quality q in PUc time interval 2,
FR_PUc(2) is the flowrate from tank TNK2 to PUc during PUc time interval 2,
TNK2_Quality(q, 2) is the value of quality q during TNK2 time interval 2,
TNK2_Quality (q, 3) is the value of quality q during TNK2 time interval 3,
TNK2_Quality(q, 4) is the value of quality q during TNK2 time interval 4, and
Duration(2), Duration(3), and Duration(4) is the duration of time intervals 2, 3, and 4 for tank TNK2.

Because the operation of PUc during time interval 2 is constant over tank TNK2 time intervals 2, 3, and 4, variable FR_PUc(2), which represents the feed rate for PUc during time interval 2, is not present in the calculation of the average feed quality during PUc operation 2.

When the Feed Entity Time Interval method is used, the number of time intervals for a process unit matches the number of intervals for the feed tank (or other feed entity), and thus any required constraints on the composition of the feed can be included within the process unit model. When the Internal Time Interval method is used, the number of time intervals is less than (or equal to) the number of intervals for the feed tank (or other feed entity). Therefore, any required feed qualities constraints would be included in the feed tank model. It is often preferable to have these constraints as part of the process unit model since these constraints might include data or variables from the process unit. The approach of including process unit constraints within the feed tank model can be useful for representing feed material composition constraints, but it does not provide a means to have the process unit model outputs (e.g. product flowrates, etc.) calculated for the tank time intervals when the Internal Time Interval method is used. The choice between Internal Time Interval and Feed Entity Interval methods is specific to each production entity, allowing each production entity to be configured using the preferred method.

Independent of which method is used to determine the preferred number of time intervals, the method requires a means to manage the time intervals for the tank and the associated production entities. As shown in FIG. 8, the time intervals for tank TNK1 are aligned with the time intervals for process units PUa and PUb. If the number of time intervals for PUa and PUb are given as input, it is straightforward to derive the corresponding time intervals for TNK1. In an optimization model, the time interval durations are variables, and the relationship between the time intervals for PUa and PUb are unknown. For example, the end of the first time interval for TNK1 will correspond to the shorter of the first time intervals of PUa and PUb. If the first time interval of PUa is shorter than the first time interval of PUb, then the first interval of TNK1 is equal to the first time interval of PUa. Otherwise, the first time interval of TNK1 is equal to the first time interval of PUb. In general, the end of each time interval for tank TNK1 is equal to the end of one time interval for PUa or PUb. This can be accomplished by defining binary variables which take the value of one when the end of a time interval of tank TNK1 is equal to the end of a time interval of either PUa or PUb, and takes the value of zero otherwise (variable by EOTI denotes the binary variable for the end of time interval, or EOTI). The following variable is defined for the first time interval of tank TNK1 and the first time interval of PUa: bv_EOTI(TNK1, 1, PUa, 1)=1, if the end of TNK1 time interval 1 is equal to the end of time interval 1 for PUa, and =0 otherwise.

More generally, the following variables are defined for the time intervals of tank TNK1 and the time intervals of process entities PUa and PUb.

| | |
|---|---|
| bv_EOTI(TNK1, nt, PUk, nk) = 1 | if the end of TNK1 time interval nt is equal to the end of time interval nk for process unit PUk, where nt = 1, 2, . . . number of tank time intervals minus one. |
| PUk = PUa, Pub | nk = 1, 2, . . . number of process entity time intervals minus one for each process entity. |

Exactly one of the binary variables for each time interval of tank TNK1 must be equal to one and the rest must be equal to zero. An equation which equates the sum of all such variables to one is used to enforce this relationship. For example:

$$\begin{aligned}&\text{bv\_EOTI(TNK1, 1, PUa, 1)} + \\ &\text{bv\_EOTI(TNK1, 1, PUa, 2)} + \\ &\text{bv\_EOTI(TNK1, 1, PUb, 1)} + \\ &\text{bv\_EOTI(TNK1, 1, PUb, 2)} + \\ &\text{bv\_EOTI(TNK1, 1, PUb, 3)} \\ &= 1\end{aligned}$$

This is the general form of the equation for a time interval of tank TNK1, where there are five time intervals to be determined. The end of the last time interval (time interval 6) is determined by the end of the time horizon. However, it is possible to reduce the equation shown above for time interval 1 of TNK1 based on logic known for the first time interval:

$$\begin{aligned}&\text{bv\_EOTI(TNK1, 1, PUa, 1)} + \\ &\text{bv\_EOTI(TNK1, 1, PUb, 1)} + \\ &= 1 \\ &\text{bv\_EOTI(TNK1, 2, PUa, 1)} + \\ &\text{bv\_EOTI(TNK1, 2, PUa, 2)} + \\ &\text{bv\_EOTI(TNK1, 2, PUb, 1)} + \\ &\text{bv\_EOTI(TNK1, 2, PUb, 2)} \\ &= 1\end{aligned}$$

Although both the original formulation and the reduced formulation are correct, the reduced formulation is a more efficient form of the equation and is preferred due to effect on the solution time of the math model solver. By definition, the value of these binary variables determines the relationship between the various time intervals for TNK1, PUa, and PUb. These binary variables are used in equations which enforce that the variable for the end of each time interval for tank TNK1 is equal to the variable for the end of the appropriate time interval of PUa or PUb. For example:

$$\begin{aligned}&\text{v\_EOTI(TNK1, 1)} = \text{v\_EOTI(PUa, 1)} \\ &\text{if bv\_EOTI(TNK1, 1, PUa, 1)} = 1 \\ &\text{v\_EOTI(TNK1, 1)} = \text{v\_EOTI(PUb, 1)} \\ &\text{if bv\_EOTI(TNK1, 1, PUb, 1)} = 1\end{aligned}$$

Since exactly one of these two binary variables is equal to 1, then one of the two equations above will determine the value of v_EOTI(TNK1, 1) as a function of the first time interval for PUa or PUb.

Figure 13:
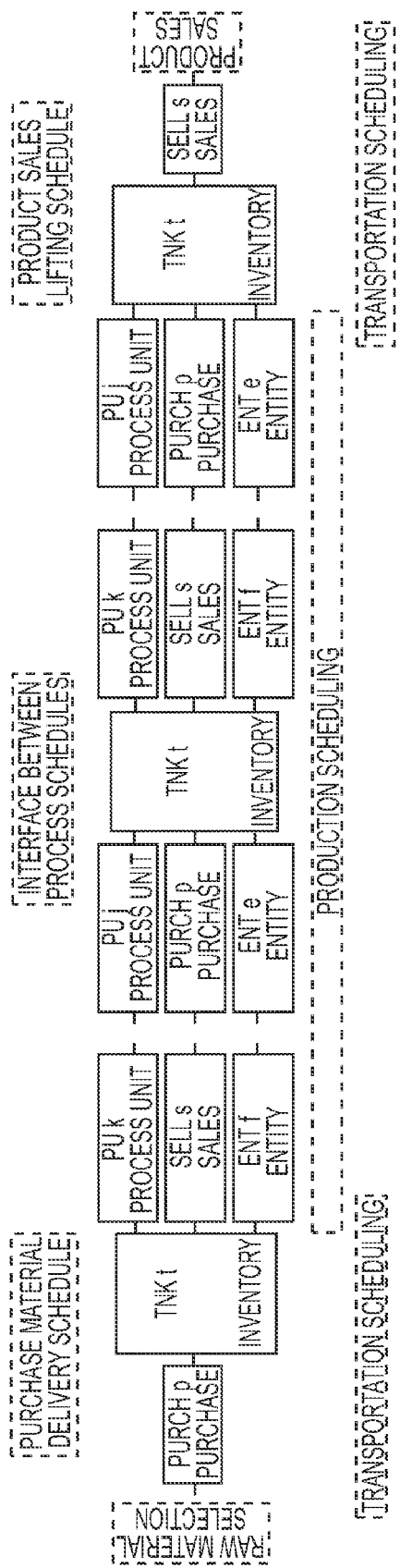
FIG. 13 shows how the present invention can be used to solve a problem encompassing transportation scheduling of feed material into a refinery, operation of the process units in the refinery, and transportation scheduling of products out of the refinery.

FIG. 13 shows how the present invention can be used to solve a problem encompassing transportation scheduling of feed material into a refinery, operation of the process units in the refinery, and transportation scheduling of products out of the refinery and using asynchronous continuous-time modeling to integrate the schedules of the various activities. The equipment used in the production facility are shown in abstract form in the middle area of FIG. 13. For example, an oil refinery model may contain submodels for process units, blenders, mixers, splitters, and other production equipment. In addition, the overall model will contain submodels representing tanks that handle the required inventory management and provide connections between various production equipment. The result is a network(s) of production equipment, tanks, and stream connections. The modeling tool may also specify the production equipment as being active or out-of-service during some portion of the time horizon.

In terms of the overall process shown FIG. 13, the submodels for each process unit, tank, or other entity will exist in multi-period form where: (a) each period corresponds to a time interval for this entity or tank, (b) the submodels for process units and other entities (for each period) are time independent models, and (c) the submodels for tanks depend on and account for time (including period duration, and scheduling of time specific actions). The operating conditions and constraints for each entity will be managed for each time interval. Model equations which span two or more time intervals for a process unit can also be included as necessary to represent process constraints that apply to the entire time horizon or some portion of the time horizon. The duration of the intervals, the operations scheduling, and the impact on inventory and other process units will be managed through the tank submodels. This modeling framework can be configured to represent a feed material selection and valuation problem, a production planning problem, a production runs planning model, a production scheduling model, transportation optimization, and inventory optimization problem, and any combination of these problems. The optimization model is solved to obtain the results as needed for the various production planning and scheduling activities.

As described previously, the submodel(s) for the tank and the time interval calculation methods provide a capability to handle the production entities with different (asynchronous) schedules. In the center of FIG. 13, one tank is shown to illustrate the role to interface between process units, purchase or sales, and other production entities (e.g. blenders, mixers, stream splitters, and etc.).

The left side of the FIG. 13 shows a tank that receives feed from a purchase entity (instead of from process entity). This represents the tank being used to handle the raw material delivery schedule, associated inventory management, and allocation to various dispositions. This configuration allows the model to handle the valuation and selection of raw materials. The corresponding data for raw material purchase alternatives (e.g. prices, available quantities, material properties, etc.) and decision variables are considered by this tank. The purchase decisions (which raw materials, how much quantity) and the tanks with the corresponding schedule intervals define the purchased material delivery schedule. The analogous activity for product sales is shown to the far right in FIG. 13 with another tank connected to a sales entity.

FIG. 13 depicts the overall approach for one production facility. The method may also be applied to two or more production facilities. For example, the model can define shared raw material sources and shared product demands, and configure two or more production facilities to compete for raw material purchases and product sales. In addition, there can be opportunities to transfer materials from one facility to another facility. Conceptually, this can be viewed as one facility selling a material that another facility then purchases. The Process Entity module can also be used to handle material transfers between facilities. Thus, the method described above for one production facility can be used to optimize a system of multiple facilities.

Figure 14:
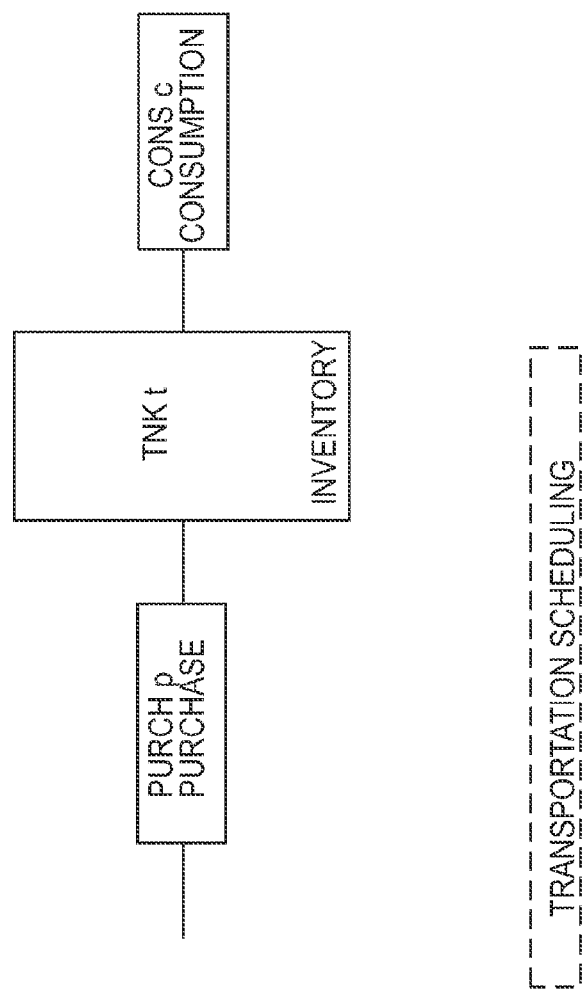
FIG. 14 shows a virtual tank to represent inventory holding between raw material purchases and consumption in a transportation scheduling problem.

FIG. 14 depicts how the optimization tool of the present invention can also be used for a highly simplified transportation scheduling model. The model uses a continuous-time representation and includes purchases, tanks (for storage), and consumption of purchased materials (which is given as input, not as a decision variable), but does exclude other production equipment in the production facility.

In addition to being used for optimizing the operation of a production facility(s), the modeling tool of the present invention can also be used for simulating the production facility(s) because the model contains the equations that are needed for the simulation calculations. In this case, the problem does not need to be solved as an optimization problem, but rather as a calculation of output for each production entity given inputs and decision variables. The simulation calculation then determines the outputs for each production entity for known values of the decision variables.

Alternatively, a single-period version of the facility model can be solved repeatedly for each simulation time period (e.g.

EXAMPLE #1

Illustrative example comparing planning (period average) calculations to production run or production schedule calculations.

| | CDU: Fuels & Asphalt operations<br>Crudes: Fuels: A & B, Asphalt: C & D |
|---|---|
| Planning model result: | optimal crude selection is a combination of two crudes:<br>2000 A + 1000 C |
| Constraint (e.g. overhead limit): | max 7.33 kBD |
| Crude A: | overhead yield = 10% |
| Crude B: | overhead yield = 2% |
| Planning constraint: | (2000 kB/30 days) * 0.10 + (1000 kB/30 days) * 0.02 <= 7.333<br>or 6.667 + 0.667 = 7.33 OK |
| Scheduling: | fuels operation for 12 days + asphalt operation for 10 days + fuels operation for 8 days |
| Period 1 (12 d): (1200/12) * 0.1 = 10 | Constraint is not feasible if crude distillation unit is run at 100 kBD (max rate)<br>(Crude A volume/12) * 0.1 <= 7.33<br>Crude A volume <= 7.333 * 12/0.1 = 880 kB<br>CDU max rate = 880/12 = 73.33 kBD, as limited by overhead constraint |
| Period 2 (10 d): | (1000/10) * 0.02 = 2<br>Constraint is feasible for period 2 |
| Period 3 (8 d): | similar to period 1 |

1 minute, 5 minutes, 10 minutes, etc). This calculation can be performed as the solution of a square system of equations for the production facility. Alternatively, a sequence of production entity and tank submodels can be solved where the sequence follows the flow of material through the production facility. The calculations are repeated for each simulation time period until the time horizon is simulated completely. In this case, the time horizon may be divided into a greater number of time intervals of shorter duration compared to the time intervals that would be preferred for optimization purposes. A finer representation of time may be desirable to report the operation of the facility and all the production entities. These shorter and greater number of simulation time slices can be feasible since the simulation calculations are less computationally demanding than the solution of the corresponding optimization model. With this approach, the optimization functionality of the asynchronous time interval model to solve simultaneous planning and scheduling optimization models can be coupled with detailed scheduling simulation functionality.

Figure 15:
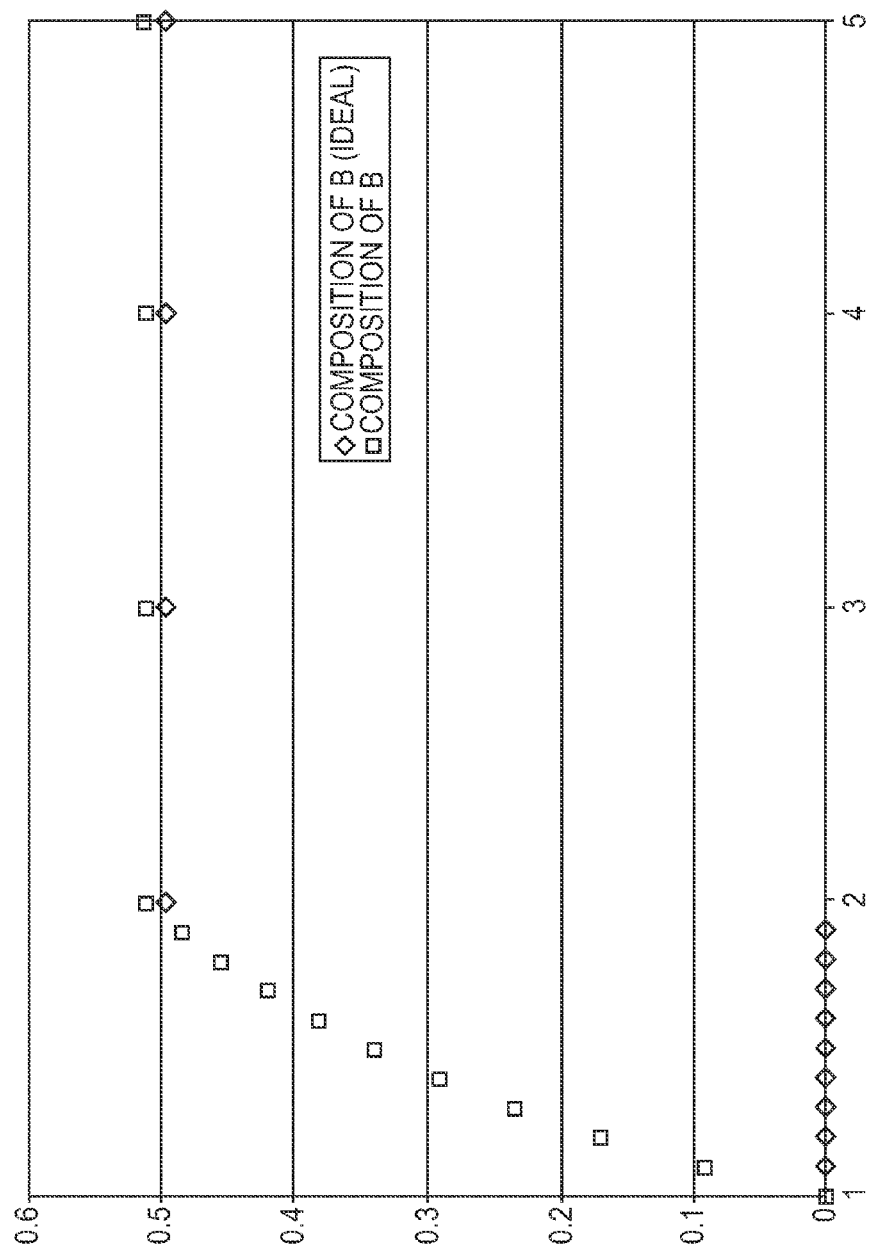
FIG. 15 is a plot showing how the composition of the tank content changes over time for ideal and non-ideal mixing.

For example, a delivery of a quantity of raw material (part of the transportation schedule) into a tank may be represented in the optimization model based on ideal mixing. Consider a tank that contains 100 units of raw material A and a delivery of 100 units of raw material B into the tank. When the delivery of raw material B is complete, an ideal mixing result would yield a 50/50 mixture of raw materials A and B in the tank. However, if the mixing is not ideal (or perfect), or if some content of the tank is being drawn off during the delivery, then the material leaving the tank may not be a 50/50 mixture of raw materials A and B (as illustrated in FIG. 15). This can affect other downstream production entities which receive this material directly or indirectly. This is just one example of a time-varying effect that may be preferred in the detailed scheduling activity. Simulation calculations can provide this additional representation of the facility operation.

This simple example illustrates the potential impact of using a period average planning model to optimize raw material purchases, and the inconsistency which arises when trying to convert the planning result into a schedule. The overhead constraint limits the CDU rate to 73.3 kBD during periods 1 and 3 (20 days). In the planning model result, the CDU rate was 100 kBD.

Figure 16:
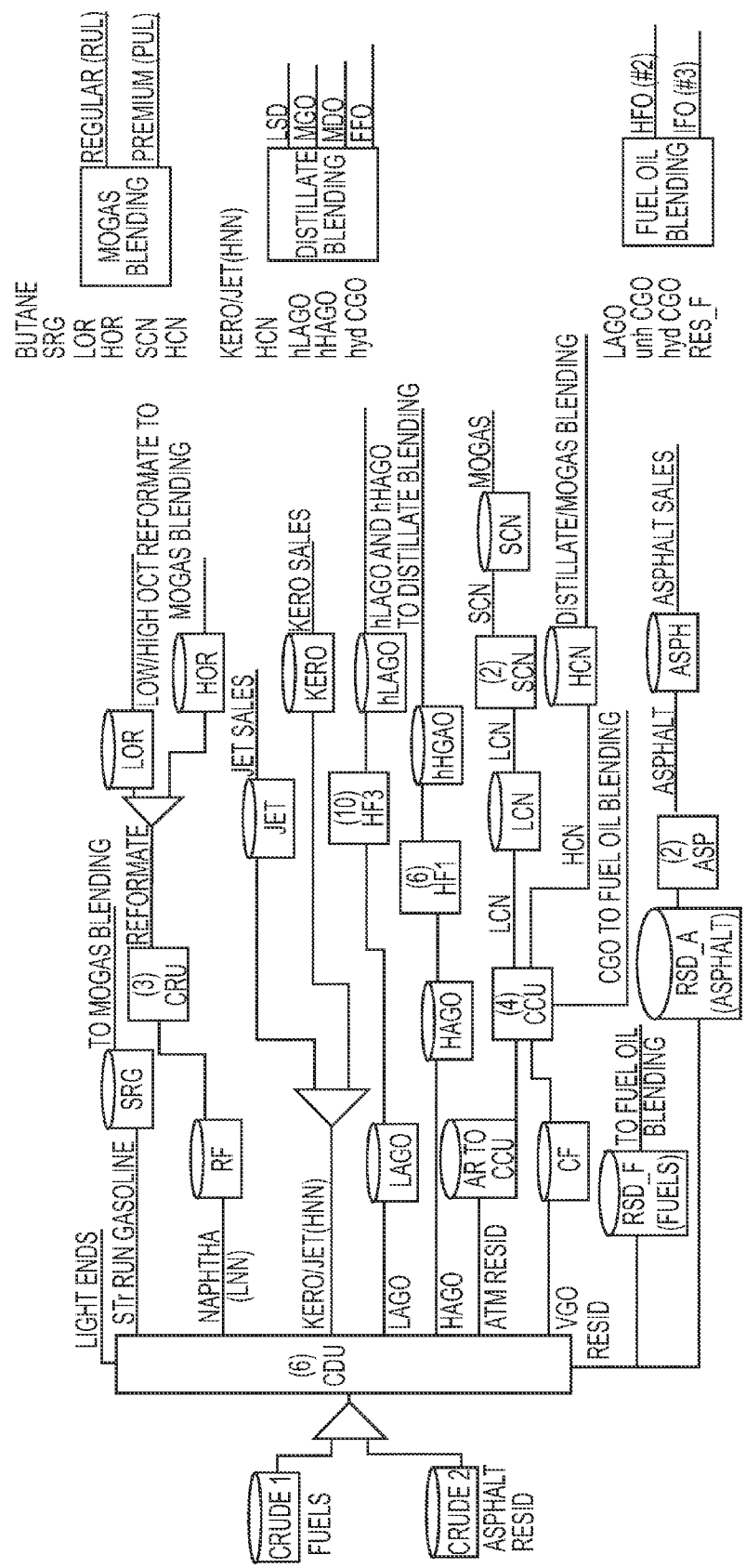
FIG. 16 shows an example schematic layout of a simple crude oil refinery.

FIG. 16 shows a flowsheet to illustrate a production processing facility composed of the following 7 process units which are displayed as rectangles: CDU, CCU, CRU, SCN, ASP, HF#1, and HF#3. Inside of each rectangle, a number is shown in parenthesis, for example "CDU (6)," to denote the number of internal time intervals for each process unit. During a one-month time horizon, the CDU will operate in six different conditions. For each process unit, the number of internal time intervals is given, and the two methods are used to determine the time intervals for the tanks (shown in FIG. 16 as cylindrical shapes) and downstream process units. The production facility also includes blending operations, and these are also shown as rectangular shapes in FIG. 16. The blenders are labeled using product groups: mogas (motor gasoline), distillate, and fuel oil. Each product group may have one or more product grades, for example, regular unleaded gasoline (RUL) and premium unleaded gasoline (PUL) in the mogas blender. Each blender product grade will have a given number of time intervals, similar to those defined for the process units.

The crude distillation unit CDU (with atmospheric distillation and vacuum distillation combined into one CDU unit entity) has three operating modes which differ by the disposition of the residue stream: fuels operation, in which the residue is sent to fuel oil blending; asphalt operation, in which the residue is sent to asphalt production; and residue operation, in which the residue is sent to a catalytic cracker. This example assumes that a one-month horizon will cycle between these three operations such that there is 6 internal time intervals (e.g. 3 for fuels mode, 2 for residual mode, and 1 for asphalt mode).

Specific crude tanks are aggregated into two groups (or segregations) such that crude can be stored to support the fuels operation (first segregation), and the asphalt and residue operations (second segregation). The CDU is fed by one of the two segregations, and the other segregation is either receiving crude deliveries, or preparing the crude for processing.

The CDU separates crude oil into streams based on their boiling points, and the streams are shown with the lightest (lowest boiling point) at the top of the CDU and the heaviest at the bottom in the following order: (1) light ends stream (stream not explicitly shown for simplicity); (2) straight run gasoline stream for blending gasoline; (3) naphtha stream, which produces a gasoline blending component; (4) Kero/Jet, which produce kerosene and jet fuel that may require further processing before being sold as finished products; (5) LAGO and HAGO (light and heavy atmospheric gasoil) streams, which are hydrofined and sent to distillate blending; (6) VGO (vacuum gasoil) is fed to the catalytic cracking process (CCU); (7) Residue: the disposition of this stream was discussed previously.

The catalytic reforming unit CRU converts naphtha into reformate, which is a gasoline blending component. The CRU can operate in one of two modes to produce low octane reformate or high octane reformate. The CRU capacity (e.g. feed rate limit) is lower for the high octane operation. In this example, the CRU is assumed to have 3 internal time intervals to allow for some combination of these two operations during the one-month time horizon. The primary CRU products are low octane reformate (LOR) and high octane reformate (HOR). There are separate tanks for LOR and HOR and it is possible to store these two gasoline blending components separately, providing additional flexibility for use in gasoline blending.

Hydrofining units HF#1 and HF#3 processes LAGO and HAGO such that these streams are suitable for use in distillate blending. In this example, HF#1 and HF#3 are assumed to have 6 and 10 internal time intervals, respectively, to allow for changes in operation during the one-month horizon. The hydrofined streams (hLAGO and hHAGO) are stored in corresponding tanks.

The catalytic cracking unit (CCU) processes VGO and residues and produces LCN, HCN, and CGO. LCN (light cat naphtha) is treated in the SCN (described below) and then becomes a gasoline blending component. HCN (heavy cat naphtha) can be a blending component for mogas or distillate. CGO (cat gasoil) is a distillate blending component and a fuel oil blending component. The CCU operation can vary with the total feed rate and the residue feed rate changing during the time horizon. In this example, four internal time interval are used for CCU. LCN, HCN, and CGO each have a corresponding tank (CGO is not shown in the figure).

The scanfining unit (SCN) treats LCN to produce scanfinate, which is a gasoline blending component. The scanfinate feedrate is expected to vary between two rates, and thus two internal time intervals are used for SCN.

The asphalt unit (ASP) processes vacuum residue to produce asphalt. Not all residue is suitable for asphalt production, and thus only residue from the CDU asphalt operation can be processed in ASP. In this example, the ASP unit is assumed to have two internal time intervals to provide two ASP operations during the time horizon. For example, the ASP can be run with a higher feedrate during one operation in order to produce more asphalt during a desired period (for example, to meet a desired asphalt production schedule).

The internal operating time intervals for these various process units are given below in Table 1. The modeling tool receives this data as input and uses this data to determine the appropriate number of time intervals to use for the production facility entities.

TABLE 1

Internal time intervals for the process units and product blenders in the refinery shown in FIG. 16.

| | Input Data for Internal Time Intervals |
|---|---|
| CDU | 6 |
| CCU | 4 |
| CRU | 3 |
| SCN | 2 |
| ASP | 2 |
| HF#1 | 6 |
| HF#3 | 10 |
| PUL | 10 |
| RUL | 10 |
| USLD | 9 |
| MGO | 6 |
| FFO | 8 |
| HFO | 10 |

The two time interval methods have been applied to the example product facility to yield the results in Table 2. The methods will be explained using one tank and the associated process units and blending units:

Tank: RSD_F

Process Unit: CDU

Blender: HFO

Process unit CDU produces the material (RSD_F) which is directed to tank RSD_F. The disposition for RSD_F is the HFO product blender. CDU has 6 internal time intervals, and the HFO blender has 10 internal time intervals. The time intervals for tank RSD_F is calculated using equation Eqn 5, as follows: $(6-1)+(10-1)+1=15$. The number of time intervals for the HFO blender is either 10 (if the Internal Time Interval method is used) or 15 (if the Feed Entity Time Interval method is used).

A second sample calculation is used to illustrate the differences between the two methods. Consider tank RF (reformer feed), and associated process units CDU and CRU. The number of time intervals for tank $RF=(6-1)+(3-1)+1=8$ (using equation Eqn 5). Considering process unit CRU, which is fed by tank RF, the number of time intervals is either 3 (using the Internal Time Interval method or 8 (using the Feed Entity Time Interval method).

The difference between the two methods is that the Feed Entity Time Interval method defines that the number of time intervals for a process unit is a function of the time intervals of the tank which feeds the process unit. Thus, since tank RF requires 8 time intervals, then process unit CRU must also have 8 time intervals. This will have a cascading effect as illustrated with tank LOR (low octane reformate) and process units CRU and blender RUL. The number of internal time intervals for unit CRU and blender RUL are 3 and 10, respectively.

The number of time intervals for tank $LOR=(3-1)+(10-1)+1=12$ if the Internal Time Interval method is used for process unit CRU. The number of time intervals for tank $LOR=(8-1)+(10-1)+1=17$ if the Feed Entity Time interval method is used for process unit CRU.

The two methods were applied to the sample production facility and the results are shown in Table 2. Columns 3 and 4 (in Table 2) contain the results obtained when either the Internal Time Interval method or the Feed Entity Time Interval method is selected for all of the process units and blenders. A set of results based on a uniform discrete-time assumption with 1 hour time periods is also included. A 1 hour uniform time period was selected to provide a basis for comparison with the asynchronous time approach. It is straight forward consider different uniform period durations (e.g. using 4 hour uniform periods would result in 180 time intervals instead of 720 time intervals). This table compares the resulting number of time intervals for each component of the production facility and illustrates the reduction of time intervals which is achieved using these two methods. The TOTAL shown at the bottom of Table 2 represents the total entity periods, where the number of periods for each process entity (e.g. process units, tanks, blenders, etc) is totaled. The results in Table 2 show the reduction in time intervals that can be achieved using an asynchronous time representation and the corresponding methods and modeling approach.

Near the bottom of Table 2, the row labeled "TOTAL" includes the sum of the number of time intervals for each entity of this example production facility. The table also reports the "AVERAGE" number of time intervals for the three methods. Both results demonstrate that the asynchronous continuous time modeling approach yields a reduction in the number of time intervals that need to be considered to solve the problem.

TABLE 2

Comparison of the number of time intervals obtained using different methods.

| | Entity | Internal Time Interval Method | Feed Entity Time Interval Method | Uniform 1-hr Time Periods |
|---|---|---|---|---|
| Units | CDU | 6 | 6 | 720 |
| | CCU | 4 | 9 | 720 |
| | CRU | 3 | 8 | 720 |
| | SCN | 2 | 10 | 720 |
| | ASP | 2 | 4 | 720 |
| | HF#1 | 6 | 11 | 720 |
| | HF#3 | 10 | 15 | 720 |
| Tanks | Crude1 | 6 | 6 | 720 |
| | Crude2 | 6 | 6 | 720 |
| | CF | 9 | 9 | 720 |
| | RSD_A | 4 | 4 | 720 |
| | RSD_R | 7 | 9 | 720 |
| | RSD_F | 15 | 15 | 720 |
| | RF | 8 | 8 | 720 |
| | LAGO | 15 | 15 | 720 |
| | HAGO | 11 | 11 | 720 |
| | LCN | 5 | 10 | 720 |
| | HCN | 20 | 25 | 720 |
| | hLAGO USLD | 18 | 23 | 720 |
| | hLAGO_MGO | 14 | 20 | 720 |
| | hHAGO | 18 | 23 | 720 |
| | Jet (Tank1) | 9 | 9 | 720 |
| | Jet (Tank2) | 9 | 9 | 720 |
| | HOR | 12 | 17 | 720 |
| | LOR | 12 | 17 | 720 |
| | SRG | 15 | 15 | 720 |
| | CGO | 13 | 18 | 720 |
| | SCN | 11 | 19 | 720 |
| Blenders | PUL | 10 | 10 | 720 |
| | RUL | 10 | 10 | 720 |
| | USLD | 9 | 9 | 720 |
| | MGO | 6 | 6 | 720 |
| | FFO | 8 | 8 | 720 |
| | HFO | 10 | 10 | 720 |
| TOTAL | | 323 | 404 | 24480 |
| AVERAGE | | 9.5 | 11.9 | 720 |

TABLE 3

Details on tank time interval calculations for Internal Time Interval method.

| Tanks | Number of Time Intervals | Upstream Entity Time Intervals | Downstream Entity Time Intervals | | |
|---|---|---|---|---|---|
| Crude1 | 6 | 0 *** | 6 | | |
| Crude2 | 6 | 0 *** | 6 | | |
| CF | 9 | 6 | 4 | | |
| RSD_A | 4 | 3 | 2 | | |
| RSD_R | 7 | 4 | 4 | | |
| RSD_F | 15 | 6 | 10 | | |
| RF | 8 | 0 | | | |
| LAGO | 15 | 6 | 10 | | |
| HAGO | 11 | 6 | 6 | | |
| LCN | 5 | 4 | 2 | | |
| HCN | 20 | 4 | 8 | 10 | 10 |
| hLAGO USLD | 18 | 10 | 9 | | |
| hLAGO_MGO | 14 | 9 | 6 | | |
| hHAGO | 18 | 6 | 8 | 6 | |
| Jet(Tank1) | 9 | 6 | 4 | | |
| Jet (Tank2) | 9 | 6 | 4 | | |
| HOR | 12 | 3 | 10 | | |
| LOR | 12 | 3 | 10 | | |
| SRG | 15 | 6 | 10 | 10 | |
| CGO | 13 | 4 | 10 | 10 | |
| SCN | 11 | 2 | 10 | 10 | |

The above optimization problem can be extended to include transportation activity. For example, raw materials (e.g. crude oils) may be shipped into the production facility by waterborne vessels. The quantity of raw material to be consumed can be calculated based on the production capacity for the time horizon (e.g. amount of raw material needed for a one month period). In this example, approximately 2,200 kB (kB denotes kilo barrels) of crude oil is needed for the one-month period. Since the class of ship used to deliver crude oil to this production site has a capacity of approximately 750 kB, the expected crude oil transportation program includes 3 shipments. Note that FIG. 16 shows two crude oil tanks, labeled as CRUDE1 and CRUDE2. In reality, each tank shown may correspond to one or more physical tanks.

The important consideration is that CRUDE1 is dedicated to the CDU fuels operation and CRUDE2 is dedicated to the CDU asphalt and residue operations. The CDU operation is expected to include a total of 6 different CDU operations during the one-month time horizon such that 3 are fuels operations, 2 are residue operations, and 1 is asphalt operations. The sequence and duration of these operations is not given. In addition, the quantity of various crude oil grades and the associated delivery schedule is not given. These are all decision variables in the optimized production plan determined by the optimization tool. The treatment of tank CRUDE2 and the corresponding time intervals is described below and illustrated in FIG. 17.

Tank CRUDE2 must receive at least one shipment to supply the quantity of raw material required for the asphalt and residue operations for process unit CDU. Consider that up to two shipments are permitted and the delivery schedule for these two shipments is unknown. Also, consider one possible operations sequence for the CDU asphalt and residue operations as shown in FIG. 17. There are 6 total time intervals for CDU, of which 3 are periods when the CDU is in fuels operation and the consumption rate from tank CRUDE2 is equal to zero. The CRUDE2 deliveries should occur during these time intervals (when the consumption rate from tank CRUDE2 is equal to zero). The row in FIG. 17 labeled as "ship" shows three time intervals for the one-month time horizon. The time interval labeled "ship#1" denotes a period of time starting at the beginning of the one-month time horizon and ending at the time when ship#1 delivers crude oil for tank CRUDE2. The time interval labeled "ship#2" denotes a period of time starting at the end of the prior time interval and ending at the time when ship#2 delivers crude oil for tank CRUDE2. Note that if only one shipment is required, then the time interval labeled "ship#2" can have a duration equal to zero. The third time interval represents the period after the last delivery until the end of the time horizon.

Following the time interval methodology, tank CRUDE2 would require 8 time intervals: CRUDE2 time intervals=(3−1)+(6−1)+1=2+5+1=8. However, inspection of the 8 time intervals reveals two time intervals which are not necessary. Table 4 describes the 8 time intervals and the activity that occurs during each time interval. Notice that time intervals 3 and 4, and 6 and 7 are two pair of adjacent time intervals which have the same activities. These two pairs of time intervals can each be collapsed into a single time interval. The consolidated time intervals are shown near the bottom of FIG. 17. The duration of the time interval for ship#1 can be short such that the ship#1 delivery occurs before the CDU asphalt operation, or it can be similar to what is shown in FIG. 17 such that the deliver occurs after the CDU asphalt operation. Since the delivery schedule for the crude shipments is unknown, this model may include both of these possibilities.

A similar result is obtained for tank CRUDE1. The number of time intervals for CRUDE1 is initially determined to be 9 and the consolidated number of time intervals is 6. The significance of this result, in this particular instance, is that the number of time intervals for these two raw material tanks remain equal to 6 even when the raw material transportation schedule is included.

TABLE 4

Explanation of tank CRUDE2 time intervals.

|   | Crude Shipment | Crude Consumption |
|---|---|---|
| 1 | maybe | 0 |
| 2 | no | asphalt |
| 3 | maybe | 0 |
| 4 | maybe | 0 |
| 5 | no | resid |
| 6 | maybe | 0 |
| 7 | maybe | 0 |
| 8 | no | resid |

TABLE 5

Consolidated tank CRUDE2 time intervals.

|   | Crude Shipment | Crude Consumption |
|---|---|---|
| 1 | maybe | 0 |
| 2 | no | asphalt |
| 3 | maybe | 0 |
| 4 | no | resid |
| 5 | maybe | 0 |
| 6 | no | resid |

The sample problem described above illustrates the use of an asynchronous time based optimization model and the ability to optimize the following throughout the time horizon: raw material transportation scheduling for determine of the optimal freight cost and ship schedule; raw material selection and valuation for determining the optimal quantity of each crude grade; production planning for determining the optimal operations for each process (process unit, blenders, etc.); production scheduling for determining the schedule of process operations and blending operations; and inventory management for maintaining feasible inventory levels throughout the time horizon and minimization of inventory holding costs.

Given a common optimization model that encompasses these activities, the method can also handle situations where certain decisions have already been made and a subset of the original decision variables remain. The model variables for those decisions which have been made can be fixed (at known values), and the model can be solved for the remaining decisions. Alternatively, the model can include fixed values for certain decisions and include additional decision variables to reflect the option to change one or more decisions based on the overall best objective function value. For example, consider that a quantity of a particular crude has been purchased for a given production facility, perhaps based on a prior model result. Given this decision, alternatives which are now available (for example, some portion of this quantity of raw material) can be considered and the model result may recommend modifying certain decisions.

The terms "first," "second," and so on, when referring to an element, are not intended to suggest a location, position, or ordering of the elements. Rather, the terms are used as labels to facilitate discussion and distinguish elements from one another. The present invention is not to be limited in scope by the specific embodiments described herein. Indeed, various modifications of the present invention, in addition to those described herein, will be apparent to those of ordinary skill in the art from the foregoing description and accompanying drawings. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Each of the disclosed aspects and embodiments of the present invention may be considered individually or in combination with other aspects, embodiments, and variations of the invention. In addition, unless otherwise specified, the steps of the methods of the present invention are not confined to any particular order of performance. Accordingly, the claims set forth below should be construed in view of the full breath and spirit of the present invention as disclosed herein.

We claim:

1. A method for operating a production facility comprising:
(a) programming a computer to construct a mathematical model of the production facility, wherein the mathematical model includes a representation of a first process unit, a second process unit, and a tank production entity;
wherein the first process unit and the second process unit transform materials that enter and exit the first and the second process units;
wherein the tank production entity stores materials handled by the production facility; wherein the first process unit is represented by a submodel containing a set of equations that model the behavior of the first process unit, a number of equations in the submodel for the first process unit being related to a number of operational time intervals for the first process unit; wherein the second process unit is represented by a submodel containing a set of equations that model the behavior of the second process unit, a number of equations in the submodel for the second process unit being related to a number of operational time intervals for the second process unit;
wherein the tank production entity is represented by a submodel containing a set of equations that model the behavior of the tank production entity, the number of equations in the submodel for the tank production entity being related to the number of operational time intervals for the first process unit and the number of operational time intervals for the second process unit,
    wherein the mathematical model further includes decision variables relating to a duration of each of the operational time intervals of the first process unit and the second process unit;
(b) solving the mathematical model to obtain solution results for the first process unit, the second process unit, and the tank production entity;
(c) using the solution results to determine an operational plan for the production facility; and
(d) operating the production facility according to the operational plan.

2. The method of claim 1, wherein the submodel for the first process unit includes decision variables relating to the operation of the first process unit, and the submodel for the second process unit includes decision variables relating to the operation of the second process unit.

3. The method of claim 1, wherein the number of operational time intervals for only the first process unit, or only the second process unit, or both the first and the second process units, are given as input.

4. The method of claim 1, wherein the mathematical model further comprises variables or mathematical relationships that represent the relationships between the number of operational time intervals of the tank production entity with the number of operational time intervals of the first process unit and the second process unit.

5. The method of claim 1, wherein the mathematical model comprises an objective function for a performance metric of the production facility;
    wherein the objective function comprises terms from the submodels for the first process unit, the second process unit, and the tank production entity that contribute to the performance metric; and
    wherein the mathematical model is solved for maximizing or minimizing the performance metric.

6. The method of claim 5, wherein the mathematical model comprises: parameters relating to cost of feed materials; parameters relating to cost of holding inventory in the tank production entity; decision variables relating to a selection of feed materials.

7. The method of claim 6, wherein the mathematical model further comprises: parameters relating to cost of transportation options; and decision variables relating to transportation scheduling.

8. The method of claim 1, wherein the tank production entity is a first tank entity, and wherein the mathematical model further includes a representation of a second tank entity; and wherein the second tank entity is represented by a submodel containing a set of equations that model the behavior of the second tank entity, the number of equations in the submodel for the second tank entity being related to the number of operational time intervals for the second process unit.

9. The method of claim 8, wherein the number of equations in the submodel for the second tank entity is further related to the number of operational time intervals for the first tank entity.

10. The method of claim 8, wherein the mathematical model further includes a representation of a third process unit that is represented by a submodel containing a set of equations that model the behavior of the third process unit, the number of equations in the submodel for the third process unit being related to a number of operational time intervals for the third process unit; wherein the number of equations in the submodel for the second tank entity is further related to the number of operational time intervals for the third process unit.

11. The method of claim 1, wherein the number of equations in the submodel for the first process unit is proportional to the number of operational time intervals for the first process unit; and wherein the number of equations in the submodel for the second process unit is proportional to the number of operational time intervals for the second process unit.

12. The method of claim 1, further comprising calculating a number of operational time intervals for the tank production entity using the number of operational time intervals for the first process unit and the number of operational time intervals for the second process unit.

13. A computer system that is programmed to perform steps that comprise:
    (a) constructing a mathematical model of a production facility, wherein the mathematical model includes a representation of a first process unit, a second process unit, and a tank production entity;
    wherein the first process unit and the second process unit transform materials that enter and exit the first and the second process units;
    wherein the tank production entity stores materials handled by the production facility;
    wherein the first process unit is represented by a submodel containing a set of equations that model the behavior of the first process unit, a number of equations in the submodel for the first process unit being related to a number of operational time intervals for the first process unit;
    wherein the second process unit is represented by a submodel containing a set of equations that model the behavior of the second process unit, a number of equations in the submodel for the second process unit being related to a number of operational time intervals for the second process unit;
    wherein the tank production entity is represented by a submodel containing a set of equations that model the behavior of the tank production entity, a number of equations in the submodel for the tank production entity being related to the number of operational time intervals for the first process unit and the number of operational time intervals for the second process unit,
    wherein the mathematical model further includes decision variables relating to a duration of each of the operational time intervals of the first process unit and the second process unit;
    (b) solving the mathematical model to obtain solution results for the first process unit, the second process unit, and the tank production entity.

14. A non-transitory computer-readable storage medium comprising instructions for:
    (a) constructing a mathematical model of a production facility, wherein the mathematical model includes a representation of a first process unit, a second process unit, and a tank production entity; wherein the first process unit and the second process unit transform materials that enter and exit the first and the second process units; wherein the tank production entity stores materials handled by the production facility; wherein the first process unit is represented by a submodel containing a set of equations that model the behavior of the first process unit, a number of equations in the submodel for the first process unit being related to a number of operational time intervals for the first process unit; wherein the second process unit is represented by a submodel containing a set of equations that model the behavior of the second process unit, a number of equations in the submodel for the second process unit being related to a number of operational time intervals for the second process unit;
wherein the tank production entity is represented by a submodel containing a set of equations that model the behavior of the tank production entity, a number of equations in the submodel for the tank production entity being related to the number of operational time intervals for the first process unit and the number of operational time intervals for the second process unit,
wherein the mathematical model further includes decision variables relating to a duration of each of the operational time intervals of the first process unit and the second process unit;
(b) solving the mathematical model to obtain solution results for the first process unit, the second process unit, and the tank production entity.

* * * * *